(12) United States Patent
Ishihara et al.

(10) Patent No.: US 10,211,927 B1
(45) Date of Patent: Feb. 19, 2019

(54) SIGNAL PROCESSING DEVICE AND SIGNAL PROCESSING METHOD

(71) Applicant: KABUSHIKI KAISHA TOSHIBA, Minato-ku (JP)

(72) Inventors: Hiroaki Ishihara, Yokohama (JP); Hidenori Okuni, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/911,926

(22) Filed: Mar. 5, 2018

(30) Foreign Application Priority Data

Sep. 15, 2017 (JP) ................................. 2017-178261

(51) Int. Cl.
*H04B 10/556* (2013.01)
*H04L 27/156* (2006.01)
*H04L 27/148* (2006.01)
*H03C 3/09* (2006.01)

(52) U.S. Cl.
CPC ......... *H04B 10/556* (2013.01); *H03C 3/0933* (2013.01); *H04L 27/148* (2013.01); *H04L 27/156* (2013.01)

(58) Field of Classification Search
CPC ....... H04L 27/38; H04L 5/06; H04L 27/2331; H04L 27/364; H04L 27/3845; H04L 2027/0065; H04L 27/1566; H04L 27/10; H04L 27/22; H04L 27/148; H04L 27/156; H03L 7/08; H03L 7/113; H03L 7/18; H04B 10/556; H03C 3/0933
See application file for complete search history.

(56) References Cited

U.S. PATENT DOCUMENTS

| | | | | |
|---|---|---|---|---|
| 4,234,852 A | * | 11/1980 | McCorkle | H04L 27/144 329/302 |
| 6,034,990 A | * | 3/2000 | Kang | H04B 1/30 332/100 |
| 6,456,887 B1 | * | 9/2002 | Dudding | A61N 1/37252 607/31 |

(Continued)

FOREIGN PATENT DOCUMENTS

JP 2015-37229 2/2015

*Primary Examiner* — Khanh C Tran
(74) *Attorney, Agent, or Firm* — Oblon, McClelland, Maier & Neustadt, L.L.P.

(57) ABSTRACT

A device of one aspect of the present invention includes a receiver to receive a modulation signal that has been subjected to frequency shift keying division ratio. The receiver includes a first demodulator and a demodulation control signal generator. The demodulation control signal generator includes a first frequency divider, a frequency control signal generator, and an oscillator. The first frequency divider divides a frequency of one of the modulation signal and the demodulation control signal by a first or second reception division ratio. The frequency control signal generator generates a frequency control signal based on a frequency of the other of the modulation signal and the demodulation control signal, and a frequency of the one of the modulation signal and the demodulation control signal obtained by division by the first or second reception division ratio. The oscillator generates the demodulation control signal based on the frequency control signal.

15 Claims, 16 Drawing Sheets

(56) References Cited

U.S. PATENT DOCUMENTS

| | | | |
|---|---|---|---|
| 6,816,559 B1* | 11/2004 | Sirito-Olivier | H04L 1/24 375/146 |
| 9,363,118 B2 | 6/2016 | Noguchi et al. | |
| 2009/0066436 A1* | 3/2009 | Wang | H03L 7/18 332/119 |
| 2009/0103671 A1* | 4/2009 | Raphaeli | G06K 7/10306 375/354 |

* cited by examiner

US 10,211,927 B1

SIGNAL PROCESSING DEVICE AND SIGNAL PROCESSING METHOD

CROSS-REFERENCE TO RELATED APPLICATION (S)

This application is based upon and claims the benefit of priority from Japanese Patent Application No. 2017-178261, filed Sep. 15, 2017; the entire contents of which are incorporated herein by reference.

FIELD

Embodiments described herein relate generally to a signal processing device and a signal processing method.

BACKGROUND

In the field of integrated circuits, it is becoming popular to use a technique to transmit electrical signals to a module isolated (insulated) by an insulating device, using an electromagnetic field generated by the insulating device. This technique enables communication between insulated modules by generating electrical signals on the other insulated module (communication partner) through a magnetic field coupling by a transformer or an electric field coupling by a capacitor element.

A signal processing device using such an electromagnetic field typically uses a high-frequency electromagnetic field due to the fact that insulation is performed with a transformer or capacitor element or due to various reasons (e.g. sizes). Hence, a communication scheme is used in which modulation is performed using the high frequency. Frequency shift keying (FSK) communication is known as one of this type of communication schemes. In FSK communication, modulation is performed in such a manner that frequency of the high frequency is switched depending on the value of communication data, and the communication data is demodulated according to the high frequency.

To precisely demodulate the communication data through a reception circuit receiving the communication data, it is necessary to precisely judge a difference in the frequency. The frequency generally depends on the oscillation frequency of the oscillator in a transmission circuit, but the oscillation frequency fluctuates with temperature, power supply voltage, and the like and then deviates from a predetermined value. Besides, demodulation in the reception circuit is also susceptible to temperature, power supply voltage, and the like. Therefore, even with calibration between the transmission circuit and the reception circuit, it is difficult to keep stable demodulation.

DETAILED DESCRIPTION

One embodiment of the present invention enables stable demodulation even if fluctuations of transmission frequency occur in FSK communication.

A signal processing device of one aspect of the present invention includes a receiver configured to receive a modulation signal that has been subjected to frequency shift keying, by dividing a reference transmission frequency by using a first or second transmission division ratio. The receiver includes a first demodulator and a demodulation control signal generator. The demodulation control signal generator includes a first frequency divider, a frequency control signal generator, and a first oscillator. The first frequency divider divides a frequency of one of the modulation signal and the demodulation control signal by a first or second reception division ratio. The frequency control signal generator generates a frequency control signal on the basis of a frequency of the other of the modulation signal and the demodulation control signal, and a frequency of the one of the modulation signal and the demodulation control signal obtained by division by the first or second reception division ratio. The first oscillator oscillates at a frequency based on the frequency control signal to generate the demodulation control signal.

Below, a description is given of embodiments of the present invention with reference to the drawings. The present invention is not limited to the embodiments.

First Embodiment

Figure 1:
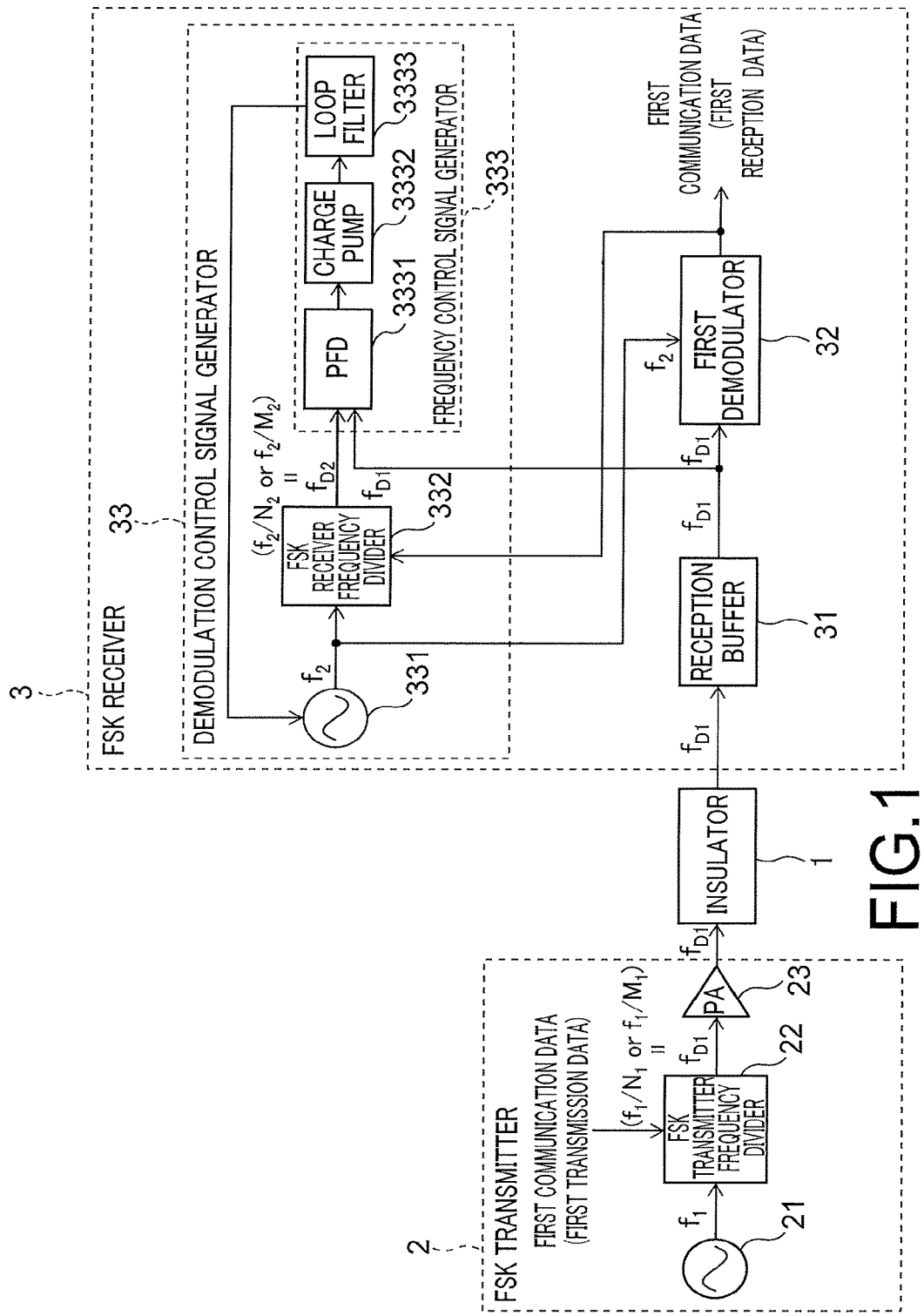
FIG. 1 is a block diagram showing an example of a signal processing device according to the first embodiment.

FIG. 1 is a block diagram showing an example of a signal processing device according to the first embodiment. The signal processing device according to the first embodiment includes an insulator 1, an FSK transmitter 2, and an FSK receiver 3. The FSK transmitter 2 includes an FSK transmitter oscillator 21, an FSK transmitter frequency divider 22, and a transmission amplifier (power amplifier: PA) 23. The FSK receiver 3 includes a reception buffer 31, a first demodulator 32, and a demodulation control signal generator 33. The demodulation control signal generator 33 includes an FSK receiver oscillator 331, an FSK receiver frequency divider 332, and a frequency control signal generator 333.

The frequency control signal generator 333 may use the configuration of a phase locked loop (PLL). The frequency control signal generator 333 may include, as shown in FIG. 1, a phase frequency detector (PFD) 3331, a charge pump 3332, and a loop filter 3333, which are components used in a PLL.

In the signal processing device according to this embodiment, the FSK transmitter 2 and the FSK receiver 3 are electrically insulated from each other by the insulator 1. The insulator 1 receives high-frequency electrical signals from the FSK transmitter 2, thereby generating a high-frequency electromagnetic field. Moreover, the insulator 1 can output high-frequency electrical signals to the FSK receiver 3 in accordance with the high frequency. For example, the insulator 1 may be a transformer, capacitor element, or combination thereof with a predetermined dielectric strength.

Incidentally, an electrical signal may refer to either a voltage, current, or electric power, unless otherwise specified.

The FSK transmitter 2 and the FSK receiver 3 perform FSK communication using the high-frequency electromagnetic field provided by the insulator 1. In this embodiment, the FSK transmitter 2 performs modulation and transmission, and the FSK receiver 3 performs reception and demodulation.

Data transmitted/received in the FSK communication according to this embodiment is denoted as first communication data. The first communication data is fed to the FSK transmitter 2. The first communication data fed to the FSK transmitter 2 is particularly denoted as first transmission data.

The FSK transmitter 2 generates electrical signals and sends them to the insulator 1. Electrical signals transmitted to the insulator 1 are denoted as FSK signals. For FSK communication, the FSK transmitter 2 converts the frequency of an FSK signal to a predetermined frequency value according to the value of the first transmission data.

The FSK receiver 3 receives electrical signals output from the insulator 1. The frequency of an electrical signal received by the FSK receiver 3 is equal to the frequency of an FSK signal generated by the FSK transmitter 2. Hence, electrical signals received by the FSK receiver 3 are also denoted as FSK signals without being distinguished from FSK signals generated by the FSK transmitter 2.

The FSK receiver 3 obtains first communication data by demodulating an FSK signal. First communication data demodulated by the FSK receiver 3 is particularly denoted as first reception data.

However, if the FSK transmitter 2 is affected by temperature, power supply voltage, or other factors, the frequency of an FSK signal deviates from a predetermined frequency value determined by the value of first transmission data. Similarly, the frequency of an electrical signal used as a reference frequency for demodulation of an FSK signal in the FSK receiver 3 deviates from a predetermined value under the influence of temperature or other factors. These factors make it difficult to judge the value of the first communication data on the basis of the frequency of the FSK signal, which results in a reduction in the accuracy of demodulation in the FSK receiver 3.

Accordingly, the FSK receiver 3 of this embodiment adjusts the frequency of a demodulation control signal used for FSK signal demodulation in accordance with a fluctuation in the frequency of an FSK signal, i.e., a deviation of the frequency of the FSK signal from a predetermined frequency value. This prevents a reduction in the accuracy of demodulation in the FSK receiver 3.

However, there are two predetermined frequency values of the FSK signal and the frequency of the FSK signal switches depending on the value of the first transmission data during communication; therefore, it is difficult to precisely detect a deviation between the current frequency of the FSK signal and a predetermined frequency value and adjust the frequency of the demodulation control signal.

In view of this, this embodiment uses a division ratio (division factor) having a predetermined relationship for modulation and demodulation of FSK signals. Thereby, the FSK receiver 3 can easily adjust the frequency of the demodulation control signal even if the frequency of the FSK signal is switched. The details will be described with the internal configurations of the FSK transmitter 2 and the FSK receiver 3.

The internal configuration of the FSK transmitter 2 will now be described. The FSK transmitter oscillator 21 oscillates at a predetermined frequency and generates electrical signals with the frequency. The electrical signal generated by the FSK transmitter oscillator 21 is hereinafter referred to as a reference transmission signal, and the frequency of the reference transmission signal is hereinafter referred to as a reference transmission frequency $f_1$. Although the reference transmission frequency $f_1$ is predetermined, fluctuations due to temperature and the like occur and the reference transmission frequency $f_1$ does not have a constant time waveform.

The FSK transmitter oscillator 21 may be a voltage controlled oscillator (VCO), a digital controlled oscillator (DCO) or other oscillators with a controllable frequency.

The FSK transmitter frequency divider 22 receives the first transmission data. There is no limitation on the source of the first transmission data. The FSK transmitter frequency divider 22 then divides the reference transmission frequency $f_1$ by a division ratio dependent on the value of the first transmission data. A division ratio dependent on the value of the first transmission data is denoted as a transmission division ratio. A frequency divided by the FSK transmitter frequency divider 22 is denoted as a transmitter divided frequency $f_{D1}$. Incidentally, the transmitter divided frequency $f_{D1}$ corresponds to the frequency of an FSK signal.

Since the value of the first transmission data is Low or High (0 or 1), there are two division ratios for the respective digital signal values and are denoted as a first transmission division ratio $N_1$ ($N_1$ is an integer) and a second transmission division ratio $M_1$ ($M_1$ is an integer satisfying $N_1 < M_1$), respectively. Here, it is assumed that the first transmission division ratio $N_1$ is selected when the first transmission data is Low, and the second transmission division ratio $M_1$ is selected when the first transmission data is High. Accordingly, the transmitter divided frequency $f_D$ is $f_1/N_1$ when the first transmission data is Low, and the transmitter divided frequency $f_{D1}$ is $f_1/M_1$ when the first transmission data is High.

The transmission amplifier 23 amplifies the FSK signal from the FSK transmitter frequency divider 22 and inputs it to the insulator 1. Incidentally, if the amplitude of the FSK signal from the FSK transmitter frequency divider 22 is adequate for transmission by the insulator 1, the transmission amplifier 23 may be omitted.

The internal configuration of the FSK receiver 3 will now be described. The reception buffer 31 receives the FSK signal as a high-frequency electrical signal output from the insulator 1 and performs waveform shaping in the amplitude direction. The frequency of the FSK signal is independent of input/output to/from the reception buffer 31. In other words, the frequency of the FSK signal remains as the transmitter divided frequency $f_{D1}$. Incidentally, if the amplitude of the FSK signal input to the FSK receiver 3 is large enough to perform demodulation, the reception buffer 31 may be omitted.

The first demodulator 32 demodulates the FSK signal from the reception buffer 31 on the basis of the demodulation control signal given from the demodulation control signal generator 33, and obtains first reception data thereby. Processing in the first demodulator 32 will be explained later with the internal configuration of the first demodulator 32.

The demodulation control signal generator 33 generates a demodulation control signal on the basis of the FSK signal and the first reception data demodulated by the first demodulator 32. Incidentally, a demodulation control signal in this embodiment is used by the first demodulator 32 as a clock signal. A demodulation control signal is hereinafter referred to as a clock signal for convenience. The frequency of a clock signal generated by the demodulation control signal generator 33 is referred to as a clock frequency $f_2$.

As described above, a clock frequency $f_2$ needs to be adjusted according to fluctuations in the frequency of an FSK signal $f_{D1}$. The demodulation control signal generator 33 compares the frequency of the FSK signal $f_{D1}$ with the clock frequency $f_2$ and determines a new clock frequency $f_2$ such that the frequencies of these two signals (comparison signals) match.

A method of adjusting a clock frequency $f_2$ will now be explained with the internal configuration of the demodulation control signal generator 33. The FSK receiver oscillator 331 generates clock signals by oscillation at a frequency based on a frequency control signal. The frequency control signal is transmitted from the frequency control signal generator 333. Like the FSK transmitter oscillator 21, the FSK receiver oscillator 331 may be an oscillator with a controllable frequency.

The FSK receiver frequency divider 332 receives first reception data from the first demodulator 32. The FSK receiver frequency divider 332 then divides a clock frequency by a division ratio dependent on the value of the first reception data. A frequency divided by the FSK receiver frequency divider 332 is denoted as a receiver divided frequency $f_{D2}$. The division ratio dependent on the value of the first reception data is denoted as a reception division ratio.

Since first transmission data is Low or High (0 or 1), first reception data is also Low or High (0 or 1). Therefore, there are two reception division ratios which are denoted as a first reception division ratio $N_2$ ($N_2$ is an integer) and a second reception division ratio $M_2$ ($M_2$ is an integer satisfying $N_2<M_2$). Here, when the first reception data is Low, the first reception division ratio $N_2$ is selected, and when the first transmission data is High, the second reception division ratio $M_2$ is selected. Hence, the receiver divided frequency $f_{D2}$ is $f_{D2}=f_2/N_2$ when the first reception data is Low, and $f_{D2}=f_2/M_2$ when the first reception data is High.

Moreover, the first reception division ratio $N_2$ and the second reception division ratio $M_2$ have predetermined relationships with the first transmission division ratio $N_1$ and the second transmission division ratio $M_1$, respectively. To be specific, the ratio $N_2/N_1$, which is obtained by dividing the first reception division ratio $N_2$ by the first transmission division ratio $N_1$, and the ratio $M_2/M_1$, which is obtained by dividing the second reception division ratio $M_2$ by the second transmission division ratio $M_1$ are made to be $A_1$ (constant). That is, $N_2/N_1=M_2/M_1=A_1$ is satisfied.

Although it is assumed that the first transmission division ratio $N_1$, the second transmission division ratio $M_1$, the first reception division ratio $N_2$, and the second reception division ratio $M_2$ are predetermined, the FSK receiver 3 may determine the reception division ratios according to predetermined transmission division ratios. In contrast, the FSK transmitter 2 may determine transmission division ratios according to predetermined reception division ratios. Before the initiation of FSK communication, a calibration period may be provided in which set values, such as transmission division ratios and reception division ratios, are determined.

The frequency control signal generator 333 generates a frequency control signal on the basis of an FSK signal frequency $f_{D1}$ and a receiver divided frequency $f_{D2}$ obtained through the FSK receiver frequency divider 332. In the example shown in FIG. 1, a PFD 3331 outputs an electrical signal for removing a difference (frequency gap) between the FSK signal frequency $f_{D1}$ and the receiver divided frequency $f_{D2}$. A charge pump performs digital-to-analog conversion on the electrical signal. A loop filter performs filtering for smoothing the electrical signal. These components have the same functions as those in a typical PLL. The electrical signal output from a loop filter serves as a frequency control signal.

The frequency control signal generated by the frequency control signal generator 333 is transmitted to the FSK receiver oscillator 331, and the FSK receiver oscillator 331 adjusts the clock frequency $f_2$ to a frequency based on the frequency control signal. Thus, the demodulation control signal generator 33 adjusts the clock frequency $f_2$ such that the FSK signal frequency $f_{D1}$ matches the receiver divided frequency $f_{D2}$.

Suppose, for example, that the first transmission data and the first reception data are both Low. In this case, the FSK signal frequency $f_{D1}$ input to the frequency control signal generator 333 is $f_1/N_1$, and the frequency $f_{D2}$ input to the frequency control signal generator 333 is $f_2/N_2$. To satisfy $f_{D1}=f_{D2}$, the frequency control signal generator 333 generates a frequency control signal with which $f_2=(N_2/N_1)\times f_1=A_1\times f_1$ is satisfied. In other words, when the first transmission data and the first reception data are both Low, the clock frequency $f_2$ is adjusted such that $f_2=A_1\times f_1$ is satisfied even if the reference transmission frequency $f_1$ fluctuates.

In contrast, when the first transmission data and the first reception data are both High, the FSK signal frequency $f_{D1}$ input to the frequency control signal generator 333 is $f_1/M_1$, and the frequency $f_{D2}$ input to the frequency control signal generator 333 is $f_2/M_2$. To satisfy $f_{D1}=f_{D2}$, the frequency control signal generator 333 generates a frequency control signal with which $f_2=(M_2/M_1)\times f_1=A_1\times f_1$ is satisfied. In other words, also when the first transmission data and the first reception data are both High, the clock frequency $f_2$ is adjusted such that $f_2=A_1\times f_1$ is satisfied even if the reference transmission frequency $f_1$ fluctuates.

Since a demodulation operation in the first demodulator 32 takes time, the timing of the switching of the first reception data value is delayed from the timing of the switching of the FSK signal frequency by the time required for the demodulation operation in the first demodulator 32. Therefore, there is a period in which the first transmission data and the first reception data are different. However, the loop band of the demodulation control signal generator 33 is set adequately narrower than the inverse of the length of a period in which the first transmission data and the first reception data are different so that fluctuations in the frequency control signal generated in that period can be reduced. Consequently, the FSK receiver oscillator 331 does not adjust the clock frequency $f_2$ in that period. In other words, when the first transmission data and the first reception data are different, the FSK receiver 3 does not adjust the clock frequency $f_2$. Thus, even if the FSK signal frequency $f_{D1}$ is switched, the clock frequency $f_2$ can be prevented from being adjusted to an error value.

As described above, the FSK receiver 3 can adjust the clock frequency $f_2$ in FSK communication such that the clock frequency $f_2$ follows fluctuations in reference transmission frequency $f_1$.

Figure 2:
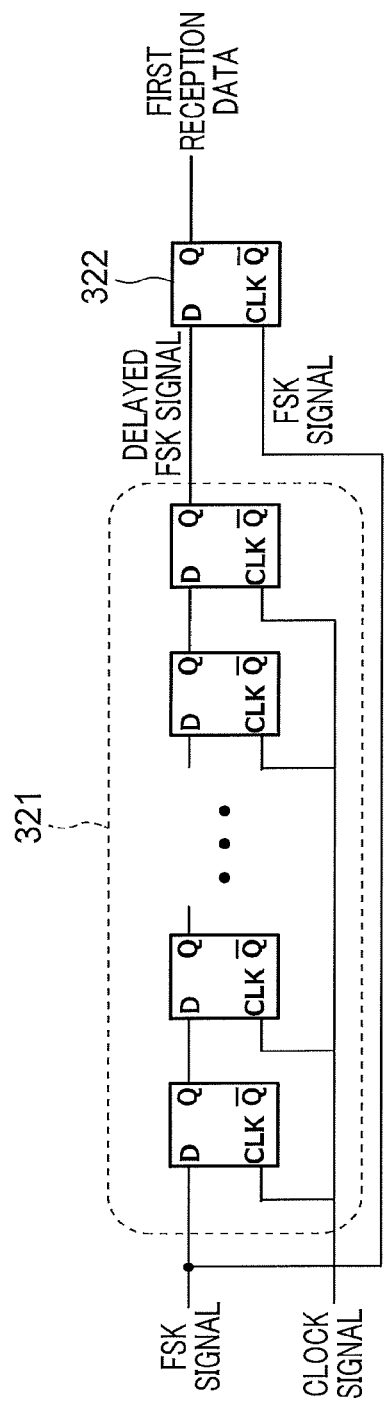
FIG. 2 is a diagram showing a first configuration example of a first demodulator.

An example of the internal configuration of the first demodulator 32 will now be described. FIG. 2 is a diagram showing a first configuration example of the first demodulator 32. In the first configuration example of the first demodulator 32, the first demodulator 32 includes a shift register (delay adder) 321 and a D flip-flop (comparator) 322. The shift register 321 includes of a D flip-flops connected in multi stages.

The shift register 321 receives the FSK signal and the clock signal and delays the FSK signal by a predetermined integral multiple of the period of the clock signal. The integer is denoted as a delay clock number L (L is an integer of one or more), and the period of the clock signal is denoted as a clock period T or simply a clock. In other words, the shift register 321 delays the FSK signal by only an L clock (L×T). In other words, the delay time of the FSK signal is an L clock. Incidentally, the number of D flip-flops in the shift register 321 is equal to the delay clock number L. In other words, D flip-flop in the shift register 321 has L stages.

The D flip-flop 322 receives a not-delayed FSK signal and an FSK signal delayed by the shift register 321. The D flip-flop 322 then judges the value of the FSK signal delayed by the shift register 321 at the rising edge of the not-delayed FSK signal. The judgment result becomes the value of first reception data.

In the case of FIG. 2, $N_2$ and $M_2$ are in a relationship represented by $N_2 > M_2/2$. Since the FSK signal and the delayed FSK signal are compared with each other, when the first transmission data is Low, it is only required that the delayed FSK signal is Low at the rising edge of the FSK signal. When the first transmission data is Low, the period of the FSK signal is an $N_2$ clock. Therefore, when the following equation (1) using a given integer p (p is 0 or more) is satisfied, demodulation is normally performed if the first transmission data is Low.

[Expression 1]

$$(p \times N_2) < L \leq \frac{N_2}{2} + (p \times N_2) \qquad (1)$$

On the other hand, when the first transmission data is High, it is only required that the delayed FSK signal is High at the rising edge of the FSK signal. When the first transmission data is High, the period of the FSK signal is an $M_2$ clock. Therefore, when the following equation (2) using a given integer q of 0 or more is satisfied, demodulation is normally performed if the first transmission data is High.

[Expression 2]

$$\frac{M_2}{2} + (q \times M_2) < L \leq M_2 + (q \times M_2) \qquad (2)$$

Therefore, a combination of integer L, $N_2$ and $M_2$ which satisfies both the equations (1) and (2) allows normal demodulation.

The smaller the delay clock number L, the smaller the number of flip-flops in the shift register, which is why a small delay clock number L is advantageous in view of circuit area and power consumption. Further, the smaller the delay clock number L, the shorter the time required for demodulation. To minimize the delay clock number L, the integer p in the equation (1) and the integer q in the equation (2) should be as low as achievable. When p=0 and q=0, the condition that the delay clock number L should satisfy is the following equation.

[Expression 3]

$$\frac{M_2}{2} < L \leq \frac{N_2}{2} \qquad (3)$$

However, $N_2 < M_2$ is satisfied as described above, which is not consistent with the equation (3). A combination of minimum integers p and q, which is consistent with the equation (3) is p=1 and q=0, where the condition (demodulation condition) that the delay clock number L should satisfy is the following equation.

[Expression 4]

$$N_2 < L \leq M_2 \qquad (4)$$

Note that, a relationship between the reception division ratios $N_2$ and $M_2$ needs to satisfy the following equations.

[Expression 5]

$$\frac{3}{2} N_2 \geq M_2 \qquad (5)$$

[Expression 6]

$$N_2 \geq \frac{1}{2} M_2 \qquad (6)$$

Therefore, the relationship needs to be $2 \times N_2 \geq M_2$.

Figure 3:
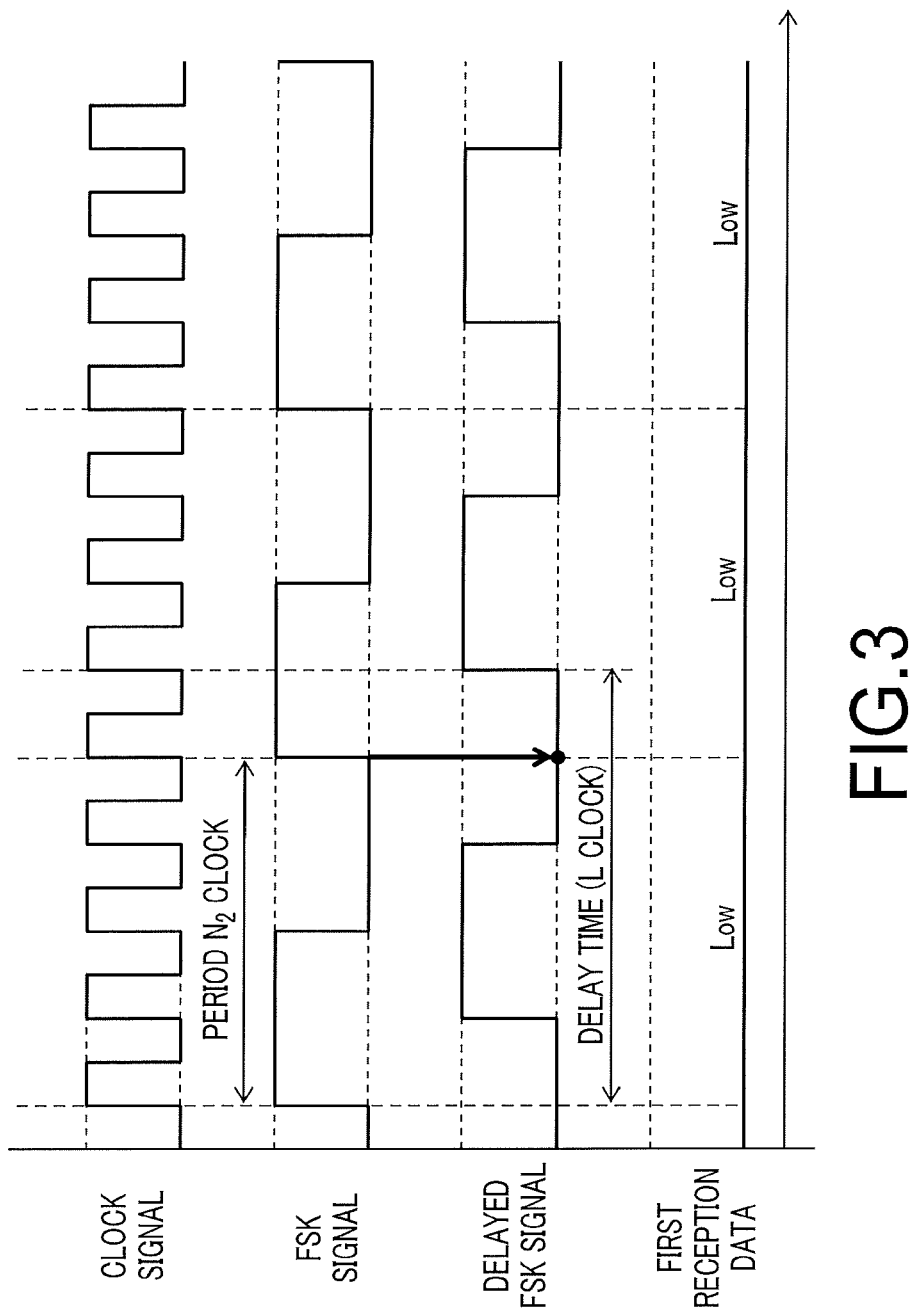
FIG. 3 is a diagram showing the operational waveforms of the first demodulator obtained when an FSK signal frequency $f_{D1}$ is $f_1/N_1$.
Figure 4:
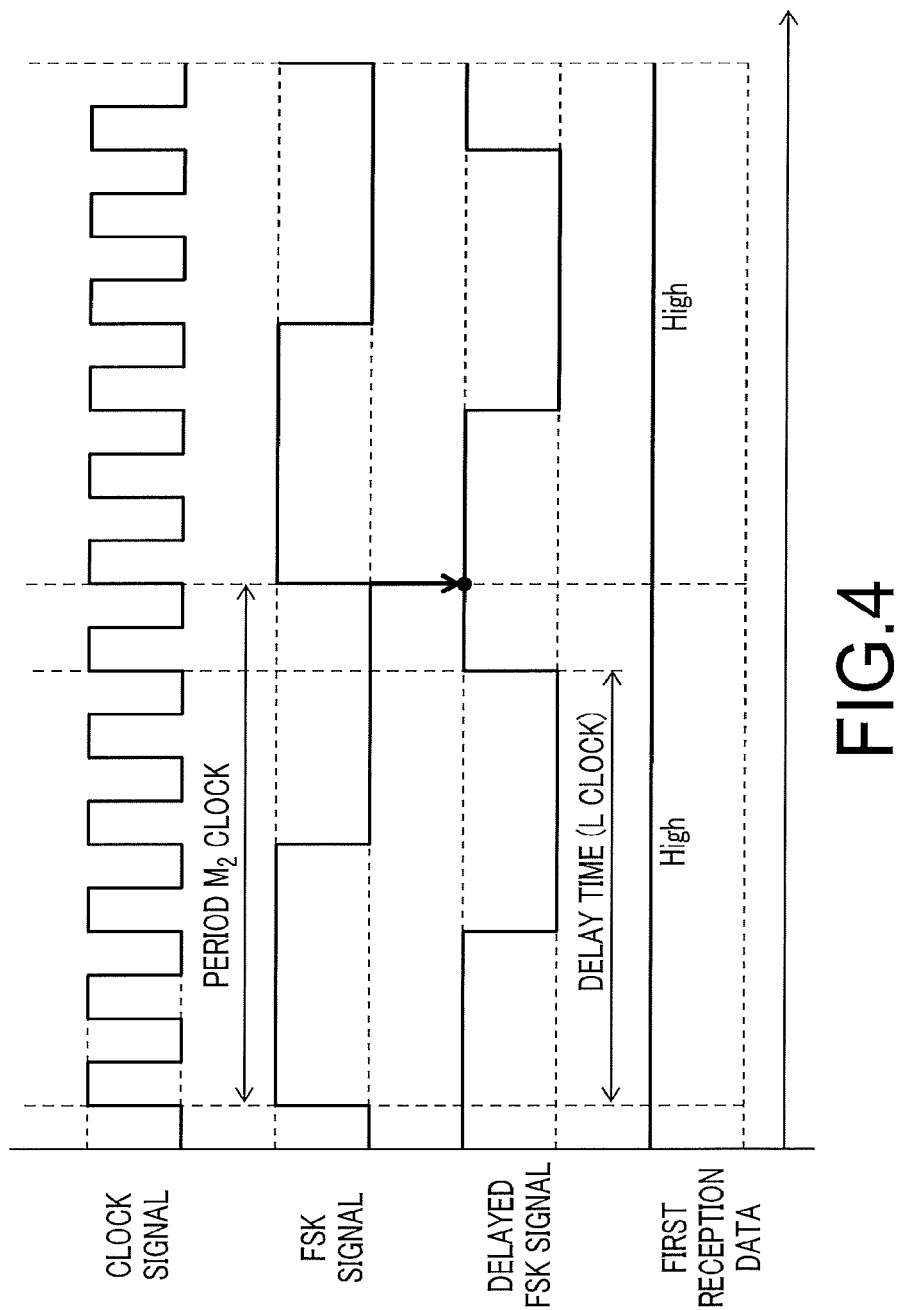
FIG. 4 is a diagram showing the operational waveforms of the first demodulator obtained when the FSK signal frequency $f_{D1}$ is $f_1/M_1$.

FIGS. 3 and 4 are diagrams showing operational waveforms of the first demodulator 32 obtained with the first configuration example of the first demodulator 32. Suppose that a set value satisfying the above-described demodulation condition is selected. In the cases shown in FIGS. 3 and 4, the first transmission division ratio $N_1$ and the first reception division ratio $N_2$ are the same value of 4, and the second transmission division ratio $M_1$ and the second reception division ratio $M_2$ are the same value of 6. The delay clock number L is 5. That is, the shift register 321 delays the FSK signal by about five clocks (5T).

FIG. 3 is a diagram showing the operational waveforms of the first demodulator 32 obtained when the FSK signal frequency $f_{D1}$ is $f_1/N_1$. Since the frequency $f_{D1}$ is $f_1/N_1$, the first transmission data is Low. The clock signal $f_2$ is adjusted such that $f_2=(N_2/N_1) \times f_1$ is satisfied, so that $f_{D1}=f_1/N_1=f_2/N_2=f_2/4$ is satisfied. Therefore, the period of the FSK signal ($1/f_{D1}$) is four times the clock period T ($4/f_2$). Thus, when the first transmission data is Low, the period of the FSK signal is an $N_2$ clock.

Moreover, as the arrow in FIG. 3 indicates, the FSK signal delayed by the shift register 321 by about five clocks is Low at the rising edge of the FSK signal. Therefore, the first reception data is Low as well as the first transmission data.

FIG. 4 is a diagram showing the operational waveforms of the first demodulator 32 obtained when the FSK signal frequency $f_{D1}$ is $f_1/M_1$. Since the frequency $f_{D1}$ is $f_1/M_1$, the first transmission data is High. In the case of FIG. 4, $f_{D1}=f_1/M_1=f_2/M_2=f_2/6$ is satisfied, so that the period of the FSK signal is six times the clock period. Thus, when the first transmission data is High, the period of the FSK signal is an $M_2$ clock.

Moreover, the FSK signal delayed by the shift register 321 by about five clocks is High at the rising edge of the FSK signal. Therefore, the first reception data is High as well as the first transmission data.

The cases in FIGS. 3 and 4 show that any combination satisfying the above-described demodulation condition allows the first reception data to coincide with the first transmission data regardless of the value of the first transmission data, thereby achieving normal demodulation.

Incidentally, even if the FSK signal and the clock signal are out of synchronization, the demodulation operation in the first demodulator 32 is normally performed if the above-described demodulation condition is satisfied, though FIGS. 3 and 4 show the case where the rising edges of the clock signal and the FSK signal are in synchronization.

When no such synchronization is established, the delay time of the delayed FSK signal, which is caused by the shift register 321, is in the range of (L−1) clock to L clock because the delay time caused in the first flip-flop is one clock or less. In practice, a fixed delay also exists. If the fixed delay is α-times the clock period T, the delay time of the FSK signal is in the range of (L−1+α) clock to (L+α) clock.

If the first demodulator 32 is designed to provide a fixed delay value adequately smaller than the clock period, α is smaller than 1. Since $N_2$, L, and $M_2$ are integers, the above-described demodulation condition is satisfied even if the delay time of the FSK signal is in the range of (L−1+α) clock to (L+α) clock. Therefore, even if the FSK signal and the clock signal are out of synchronization, the demodulation operation in the first demodulator 32 is normally performed if the above-described demodulation condition is satisfied.

Figure 5:
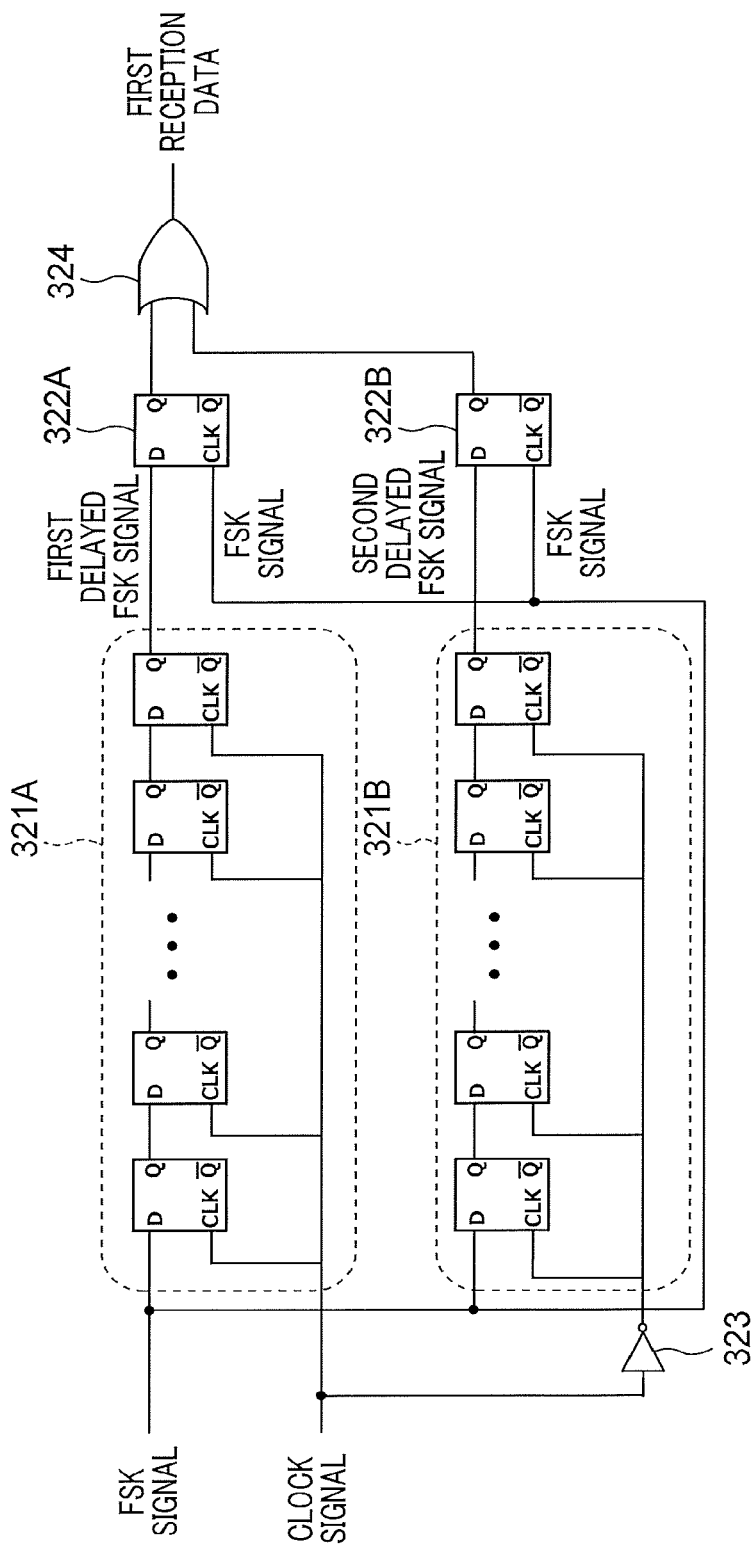
FIG. 5 is a diagram showing a second configuration example of the first demodulator.

Another example of the internal configuration of the first demodulator 32 will now be described. FIG. 5 is a diagram showing a second configuration example of the first demodulator 32. In the second configuration example of the first demodulator 32, L, $N_2$, and $M_2$ are integers and $N_2<L<M_2$ is also satisfied, $M_2$ needs to be larger than $N_2$ by two or more. However, in the second configuration example, demodulation can be performed even if $M_2$ is larger than $N_2$ by 1.

In the configuration shown in FIG. 5, the first demodulator 32 includes two sets (delay stages) of the shift register 321 and the D flip-flop 322 shown in the configuration example shown in FIG. 2.

This configuration includes an inverter 323 that generates a signal having a phase opposite to that of a clock signal (an opposite-phase clock signal), and an OR circuit 324 to which the delay stages add delayed FSK signals.

Incidentally, the opposite-phase clock signal may be generated by a method other than through the inverter 323. For example, the first demodulator 32 may include a differential oscillator not shown in the drawing, and the opposite-phase clock signal may be directly retrieved from the oscillator. In this case, the inverter 323 may be omitted.

One delay stage (in FIG. 5, a shift register 321A and a D flip-flop 322A) receives the FSK signal and the clock signal as in FIG. 2. The other delay stage (in FIG. 5, a shift register 321B and a D flip-flop 322B) receives the FSK signal and the opposite-phase clock signal. In either delay stage, the delay time of the FSK signal is in the range of (L−1+α) clock to (L+α) clock. Further, since the opposite-phase clock signal is used, a difference between two delay times is half the clock period. Therefore, the shorter delay time is in the range of (L−1+α) clock to (L−0.5+α) clock, and the longer delay time is in the range of (L−0.5+α) clock to (L+α) clock.

The OR circuit 324 receives electrical signals (a third comparison signal and a fourth comparison signal) from the respective two delay stages, and selects the electrical signal related to the shorter delay time. Selective use of one of the shorter delay time and the longer delay time allows selection of a delay time every 0.5 period. To select the electrical signal related to the longer delay time, an AND circuit should be used instead of the OR circuit 324.

For example, in the case shown in FIG. 5, assuming that the delay clock number L is 5, the shorter delay time is in the range of (4+α) clock to (4.5+α) clock. If the fixed delay is designed to be smaller than 0.5 clock, the above-described demodulation condition is satisfied even if the first reception division ratio $N_2$ is 4 and the second reception division ratio $M_2$ is 5. Therefore, in this configuration, the demodulation operation is achievable even if $M_2$ is larger than $N_2$ only by 1. Thus, a frequency variation width in FSK communication can be reduced.

Figure 6:
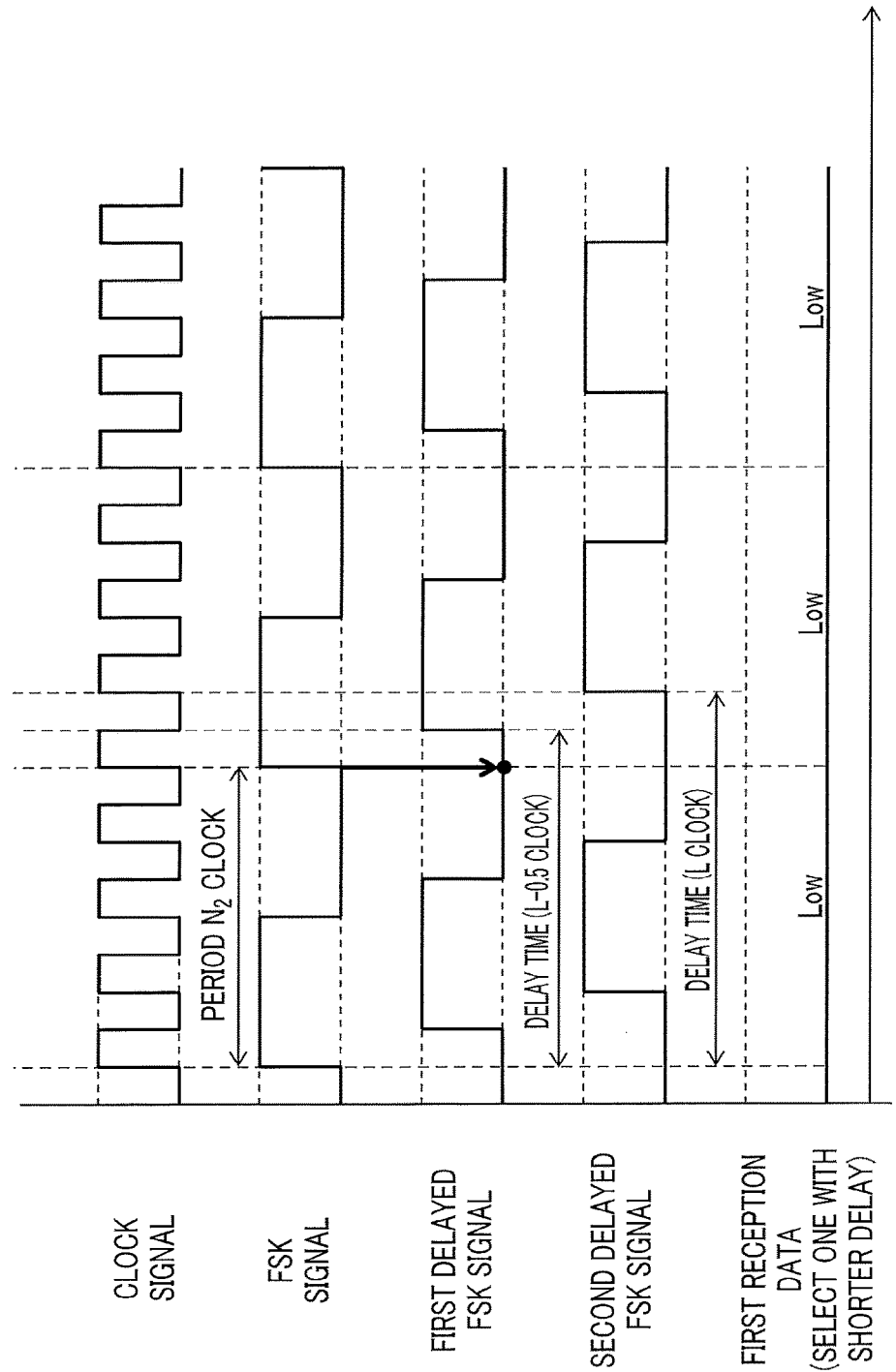
FIG. 6 is a diagram showing the operational waveforms of the second configuration example of the first demodulator obtained when the FSK signal frequency $f_{D1}$ is $f_1/N_1$.
Figure 7:
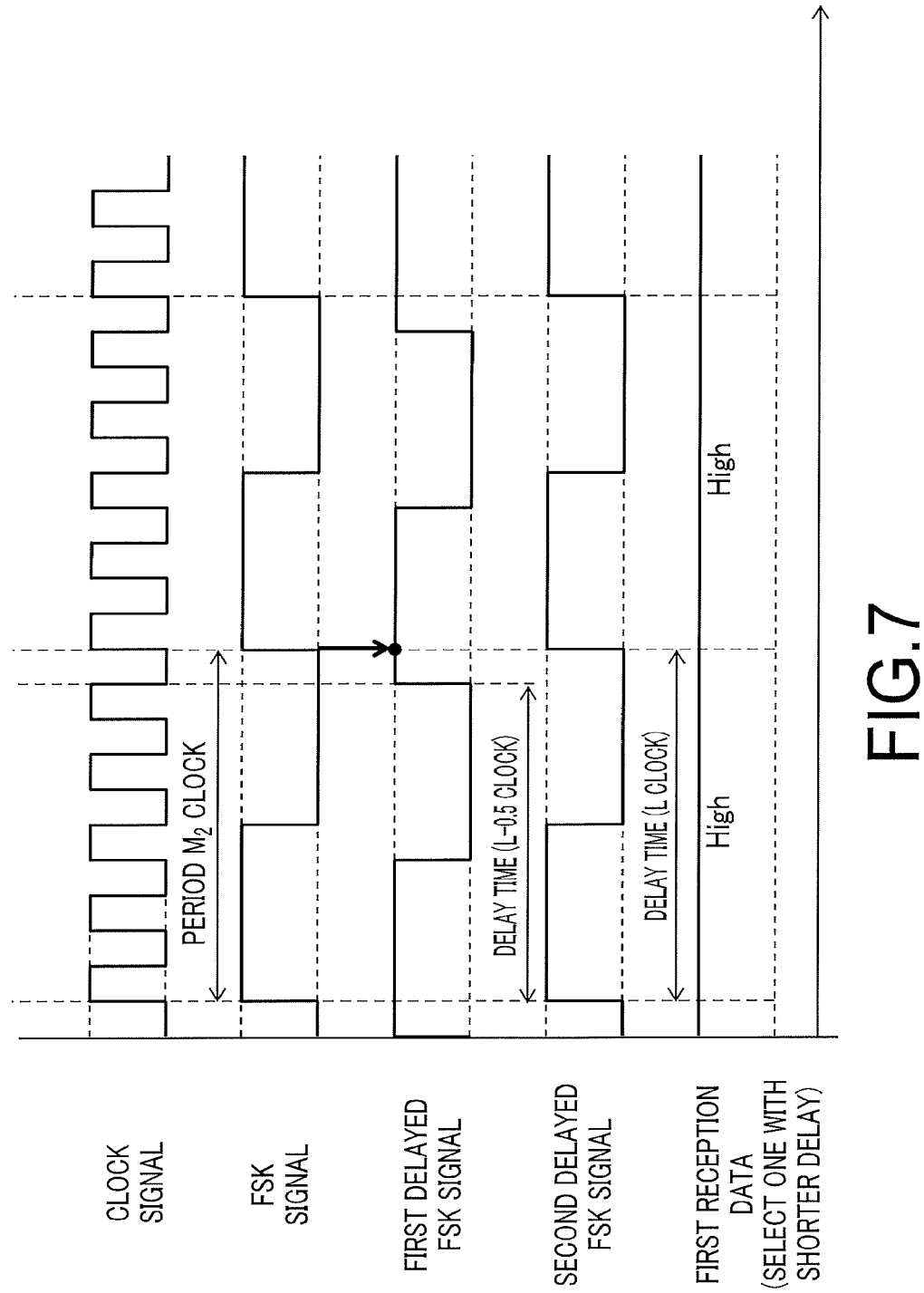
FIG. 7 is a diagram showing the operational waveforms of the second configuration example of the first demodulator obtained when the FSK signal frequency $f_{D1}$ is $f_1/M_1$.

FIGS. 6 and 7 are diagrams showing operational waveforms of the second configuration example of the first demodulator 32. FIG. 6 is a diagram showing the operational waveforms of the second configuration example of the first demodulator 32 obtained when the FSK signal frequency $f_{D1}$ is $f_1/N_1$. FIG. 7 is a diagram showing the operational waveforms of the second configuration example of the first demodulator 32 obtained when the FSK signal frequency $f_{D1}$ is $f_1/M_1$. In the cases shown in FIGS. 6 and 7, the first transmission division ratio $N_1$ and the first reception division ratio $N_2$ are the same value of 4, and the second transmission division ratio $M_1$ and the second reception division ratio $M_2$ are the same value of 5. Further, the delay clock number L is 5.

As described above, the OR circuit 324 selects the shorter delay time, so that, as shown in FIGS. 6 and 7, a first delay FSK signal which is delayed by (L−0.5) clock is selected. Even if the first delay FSK signal is selected, the first reception data which is similar to that obtained with the first internal configuration of the first demodulator 32 is obtained.

Incidentally, in this configuration example, $M_2$ may be larger than $N_2$ by two or more. Further, as in this configuration example, increasing the resolution of delay times improves the accuracy of demodulation.

Figure 8:
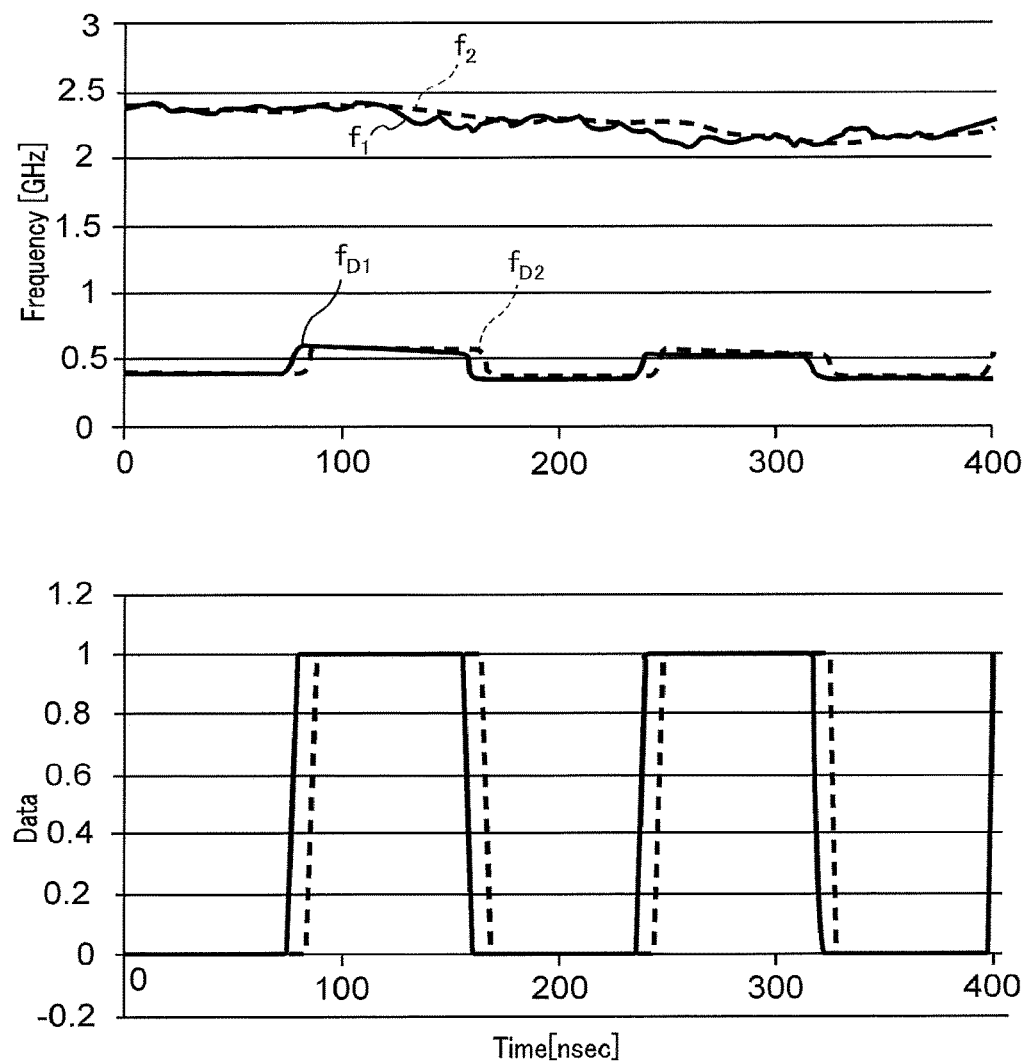
FIG. 8 is a diagram showing time fluctuations in each signal related to the signal processing device of the first embodiment.

FIG. 8 is a diagram showing time fluctuations in each signal related to the signal processing device of the first embodiment. In the example shown in FIG. 8, the first transmission division ratio $N_1$ and the first reception division ratio $N_2$ are 4, the second transmission division ratio $M_1$ and the second reception division ratio $M_2$ are 6, and the reference transmission frequency $f_1$ is about 2.4 GHz.

The upper two graphs in FIG. 8 are graphs of the reference transmission frequency $f_1$ and the clock frequency $f_2$. The two graphs near the center of FIG. 8 are graphs of the frequencies of two comparison signals (the transmitter divided frequency $f_{D1}$ and the receiver divided frequency $f_{D2}$) input to the frequency control signal generator. The two lower graphs in FIG. 8 represent the first transmission data and the first reception data. The graphs of the first transmission data and the first reception data are pulse waveforms including delays due to demodulation processing and the like, the graph of the first reception data is shown as like a wave delayed from the graph of the first transmission data.

The graphs of the reference transmission frequency $f_1$ and the clock frequency $f_2$ show that the clock frequency $f_2$ fluctuates with fluctuations in the reference transmission frequency $f_1$. In other words, even if the reference transmission frequency $f_1$ fluctuates, the clock frequency $f_2$ is automatically adjusted without calibration. Further, as described above, the loop band of the demodulation control signal generator 33 is properly set and the influence of delays due to demodulation processing is suppressed, so that an abnormal value of the clock frequency $f_2$ never occurs during the period from a change in the value of the first transmission data to a change in the value of the first reception data. Moreover, the graphs of the first reception data and the first transmission data show that the first demodulator 32 performs normal demodulation.

When there is a large frequency gap between the FSK signal frequency $f_{D1}$ and the receiver divided frequency $f_{D2}$, there is a risk of abnormal demodulation. Therefore, the transmission division ratio, the reception division ratio, the loop band of the demodulation control signal generator 33, and the like are preferably set such that the frequency gap falls within an allowable range.

Further, before the initiation of FSK communication, e.g., at power-on, set values, such as the transmission division ratio, the reception division ratio, and the reference transmission frequency $f_1$, may be determined and a calibration mode period involving fixation to the set values may be provided. For example, at power-on, the signal processing device may go into the calibration mode, and the frequencies of the oscillators at the transmission-side and the reception-side are fixed to set values. At the end of the calibration mode period, the signal processing device may go into the communication mode, and FSK communication may be started with the set values.

There is no limitation on the length of the calibration mode period. For example, the calibration mode period may end after a lapse of a predetermined length of time. Alternatively, the calibration mode period may end when an adjustment judger (not shown in the drawing) provided in the demodulation control signal generator 33 determines that adjustment has been completed.

Figure 9:
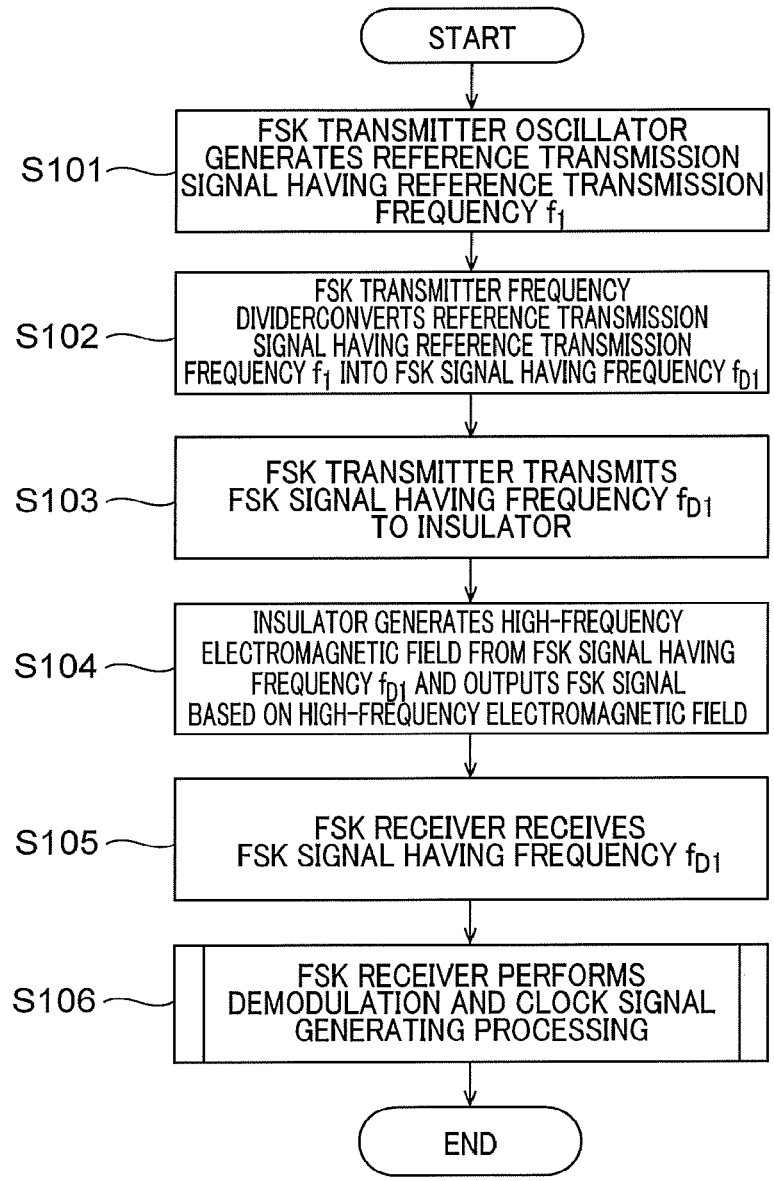
FIG. 9 is an example schematic flow chart of FSK communication processing related to the first embodiment.

FIG. 9 is an example schematic flow chart of FSK communication processing related to the first embodiment. Set values including the reference transmission frequency $f_1$ are predetermined.

The FSK transmitter oscillator 21 generates a reference transmission signal (S101). The FSK transmitter frequency divider 22 converts the reference transmission signal into an FSK signal having a frequency $f_{D1}$ (S102). The FSK transmitter 2 transmits the FSK signal having the frequency $f_{D1}$ to the insulator 1 via the PA 23 or the like (S103).

The insulator 1 receiving the FSK signal having the frequency $f_{D1}$ generates a high-frequency electromagnetic field from the FSK signal and outputs the FSK signal as an electrical signal through the high-frequency electromagnetic field (S104). The FSK receiver 3 receives the FSK signal having the frequency $f_{D1}$ through the electrical signal (S105). The FSK receiver 3 receiving the FSK signal having the frequency $f_{D1}$ performs demodulation and clock signal generating processing (S106).

Figure 10:
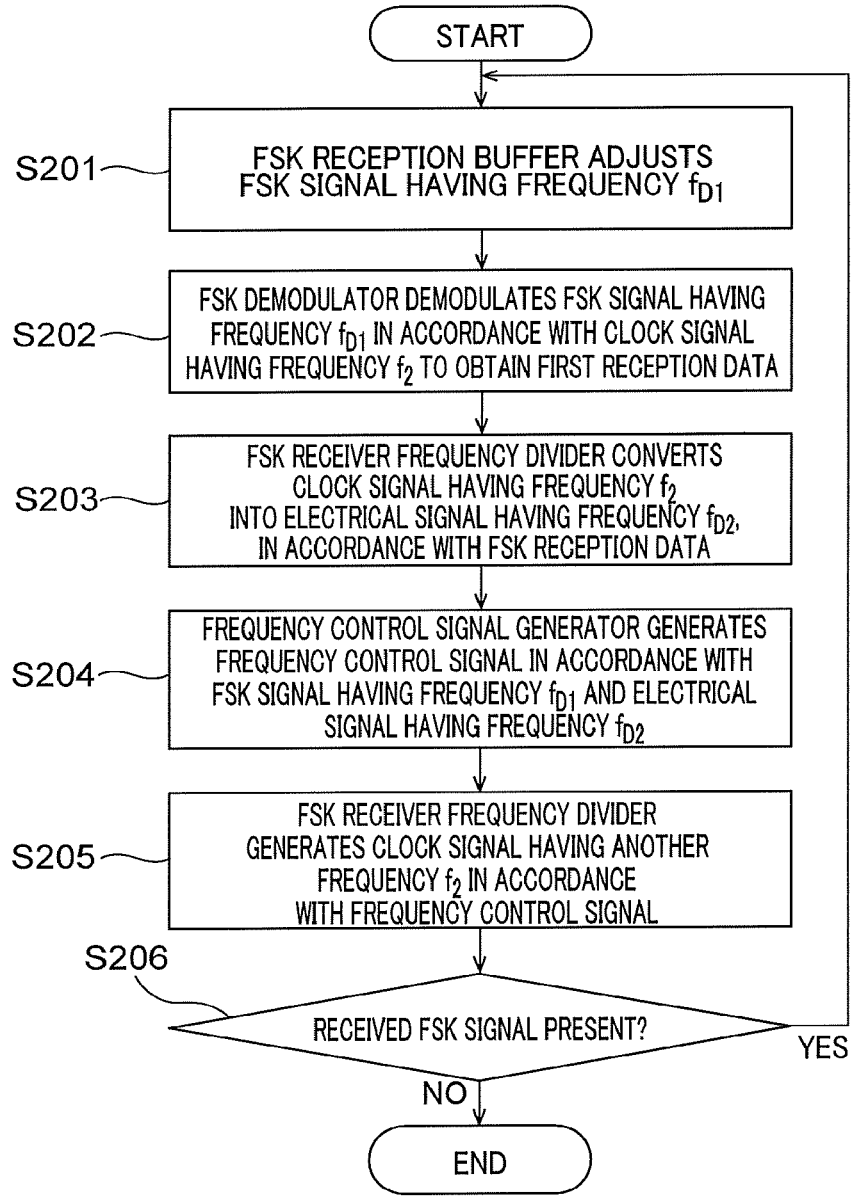
FIG. 10 is an example schematic flow chart of demodulation and clock signal generating processing in an FSK receiver.

FIG. 10 is an example schematic flow chart of demodulation and clock signal generating processing in the FSK receiver 3. This flow shows processing performed in the step S106 shown in FIG. 9.

The FSK reception buffer 31 adjusts the amplitude and the like of the received FSK signal having the frequency $f_{D1}$ (S201). The first demodulator 32 then demodulates the FSK signal having the frequency $f_{D1}$ on the basis of a clock signal having a frequency $f_2$, thereby obtaining first reception data (S202). The generated first reception data is transmitted to the demodulation control signal generator 33, and the FSK receiver frequency divider 332 in the demodulation control signal generator 33 converts the clock signal having the frequency $f_2$ into an electrical signal having the frequency $f_{D2}$, on the basis of the first reception data (S203). The frequency control signal generator generates a frequency control signal for controlling the frequency $f_2$, on the basis of the electrical signal having the frequency $f_{D1}$ and the electrical signal having the frequency $f_{D2}$ (S204). The FSK receiver oscillator 331 generates a clock signal having another frequency $f_2$, on the basis of the frequency control signal.

If the FSK signal received by the FSK receiver 3 remains (YES in S206), the process returns to the step S201, and the steps S201 to S205 are repeated. If the FSK signal received by the FSK receiver 3 does not remain (NO in S206), the flow ends.

Incidentally, the configuration of this embodiment is merely illustrative, and each component may be replaced as appropriate with another component that is capable of equivalent processing, depending on the specifications of the signal processing device.

Figure 11:
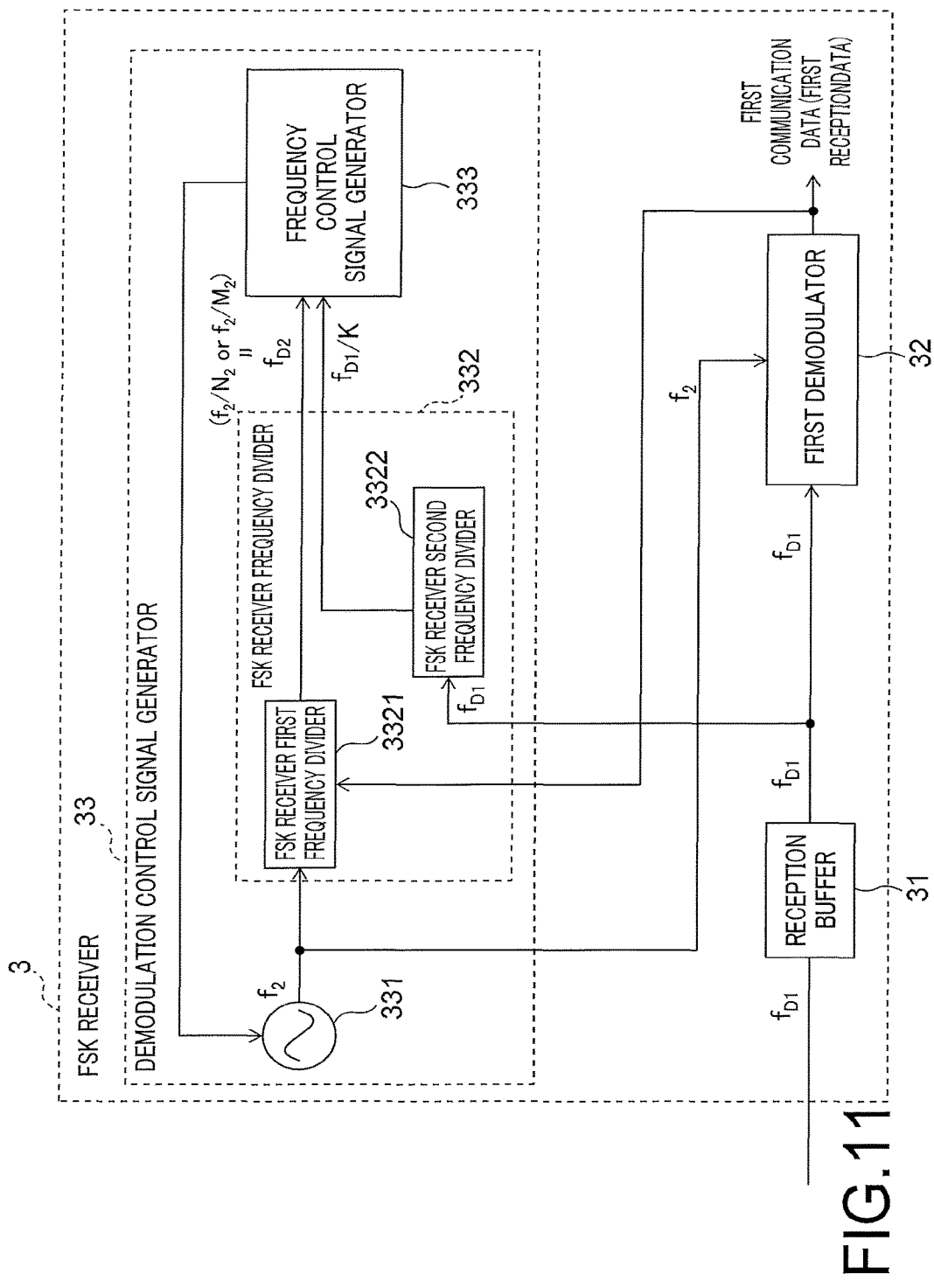
FIG. 11 is a diagram showing a second configuration example of the FSK receiver.

FIG. 11 is a diagram showing a second configuration example of the FSK receiver 3. In the example shown in FIG. 11, the FSK receiver frequency divider 332 includes an FSK receiver first frequency divider 3321 and an FSK receiver second frequency divider 3322. The configuration of the second configuration example of the FSK receiver 3 can be regarded as being equivalent to the first configuration example shown in FIG. 1 added with the FSK receiver second frequency divider 3322.

The FSK receiver first frequency divider 3321 performs the same processing as the FSK receiver frequency divider 332 of the first configuration example shown in FIG. 1. In other words, a clock frequency $f_2$ is divided and converted into a receiver divided frequency $f_{D2}$.

The FSK receiver second frequency divider 3322 divides an FSK signal frequency $f_{D1}$ by a fixed division ratio K (K is a positive integer). Thereby, the frequency control signal generator 333 does not receive an FSK signal having the frequency $f_{D1}$ but a comparison signal having a frequency $f_{D1}/K$. Hence, the operation frequency of components of the frequency control signal generator 333, such as the PFD 3331, can be reduced to 1/K.

In the second configuration example of the FSK receiver 3, the frequency $f_{D2}$ and the frequency $f_{D1}/K$ are controlled by the frequency control signal generator 333 to be equal, so that a relationship between the reference transmission frequency $f_1$ and the clock frequency $f_2$ is represented by $f_2=(N_2f_1)/(N_1K)=(M_2f_1)/(M_1K)=(A_1/K)\times f_1$.

Figure 12:
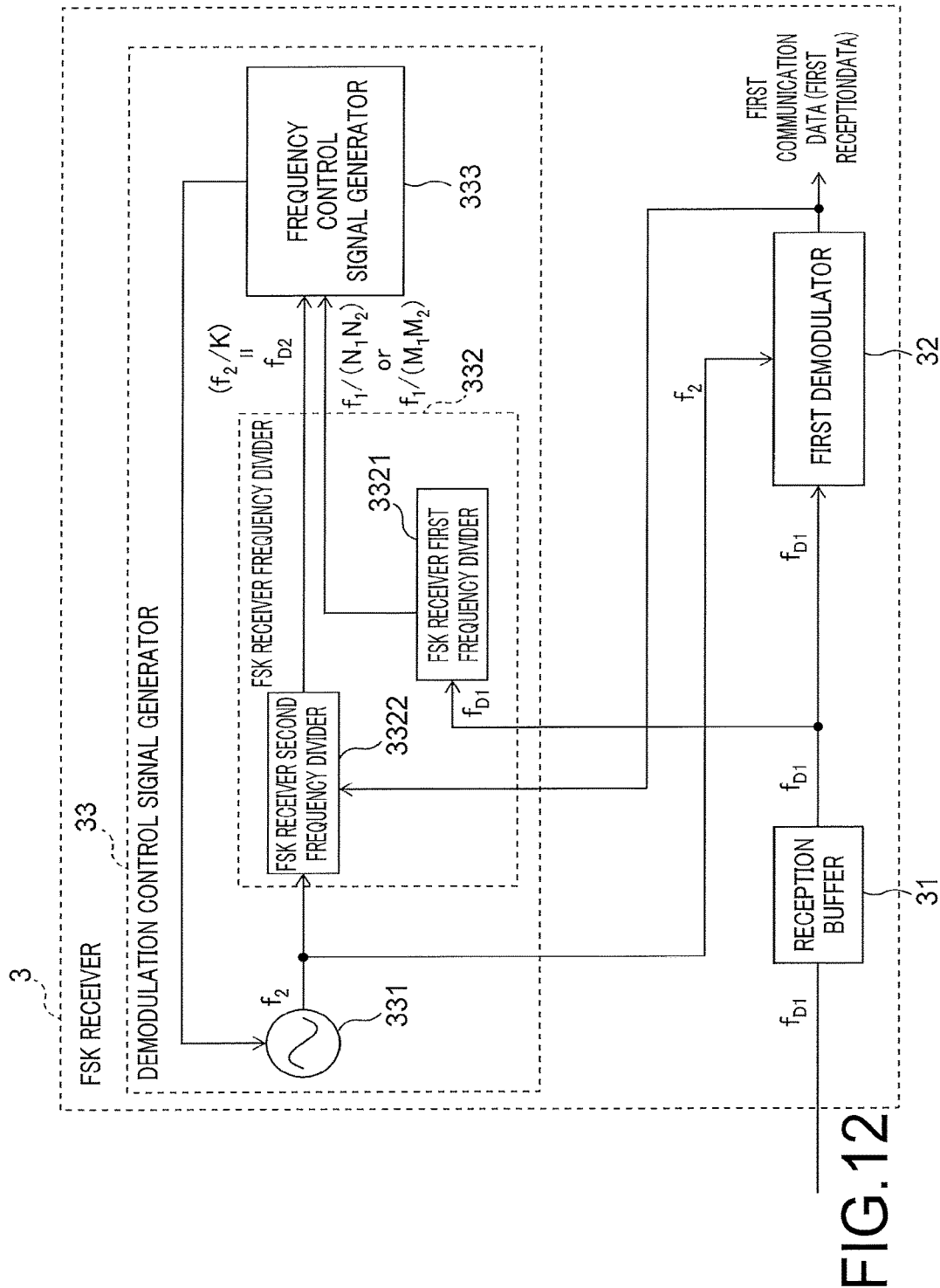
FIG. 12 is a diagram showing a third configuration example of the FSK receiver.

FIG. 12 is a diagram showing a third configuration example of the FSK receiver 3. The third configuration example is a configuration in which the places of the FSK receiver first frequency divider 3321 and FSK receiver second frequency divider 3322 in the second configuration example are exchanged.

In this configuration example, the first transmission division ratio $N_1$, the second transmission division ratio $M_1$, the first reception division ratio $N_2$, and the second reception division ratio $M_2$ are selected such that not a relationship represented by $N_2/N_1=M_2/M_1$ but $N_1 \times N_2=M_1 \times M_2=A_2$ ($A_2$ is an integer) is satisfied.

In this configuration example, two frequencies input to the frequency control signal generator 333 are $f_2/K$ and $f_1/(N_1 \times N_2)$ when the first reception data is Low, and $f_2/K$ and $f_1/(M_1 \times M_2)$ when the first reception data is High. Therefore, when the first reception data is Low, the clock frequency $f_2$ is controlled such that $f_2=\{K/(N_1 \times N_2)\} \times f_1 = (K/A_2) \times f_1$ is satisfied. In contrast, when the first reception data is High, the clock frequency $f_2$ is controlled such that $f_2=\{K/(M_1 \times M_2)\} \times f_1=(K/A_2) \times f_1$ is satisfied. Therefore, also in this configuration example, the clock frequency $f_2$ is controlled such that $f_2=(K/A_2) \times f_1$ is satisfied independently of the first reception data.

Also in this configuration example, the frequency input to the frequency control signal generator 333 is suppressed, so that the operation frequencies of the components of the frequency control signal generator 333 can be reduced. Incidentally, the FSK receiver second frequency divider 3322 may be omitted in this configuration example in such a case that the frequency $f_2$ of the clock frequency does not need to be suppressed.

As described above, the FSK receiver frequency divider 332 may divide the frequency of one of the FSK signal and the clock signal (two comparison signals) by the first or second reception division ratio selected according to the value of the demodulated first reception data, and may further divide the frequency of the other of the FSK signal and the clock signal by the fixed division ratio K. In this case, a frequency control signal is generated based on not only the frequency obtained after division by the first or second reception division ratio but also the frequency obtained after division by the fixed division ratio K.

Incidentally, the demodulation control signal generator 33 may have either a configuration using a PLL or a frequency locked loop (FLL) using a frequency detector (FDD) instead of the PFD 3331. In addition, the PLL 3331 or the like may be either an analog circuit or a digital circuit.

As described above, in this embodiment, the clock frequency $f_2$ is adjusted such that a relationship between the reference transmission frequency $f_1$ and the clock frequency $f_2$ is kept constant. Accordingly, the clock frequency $f_2$ is adjusted according to fluctuations in the reference transmission frequency $f_1$, thereby suppressing a reduction in the accuracy of demodulation using the clock frequency $f_2$.

Second Embodiment

Figure 13:
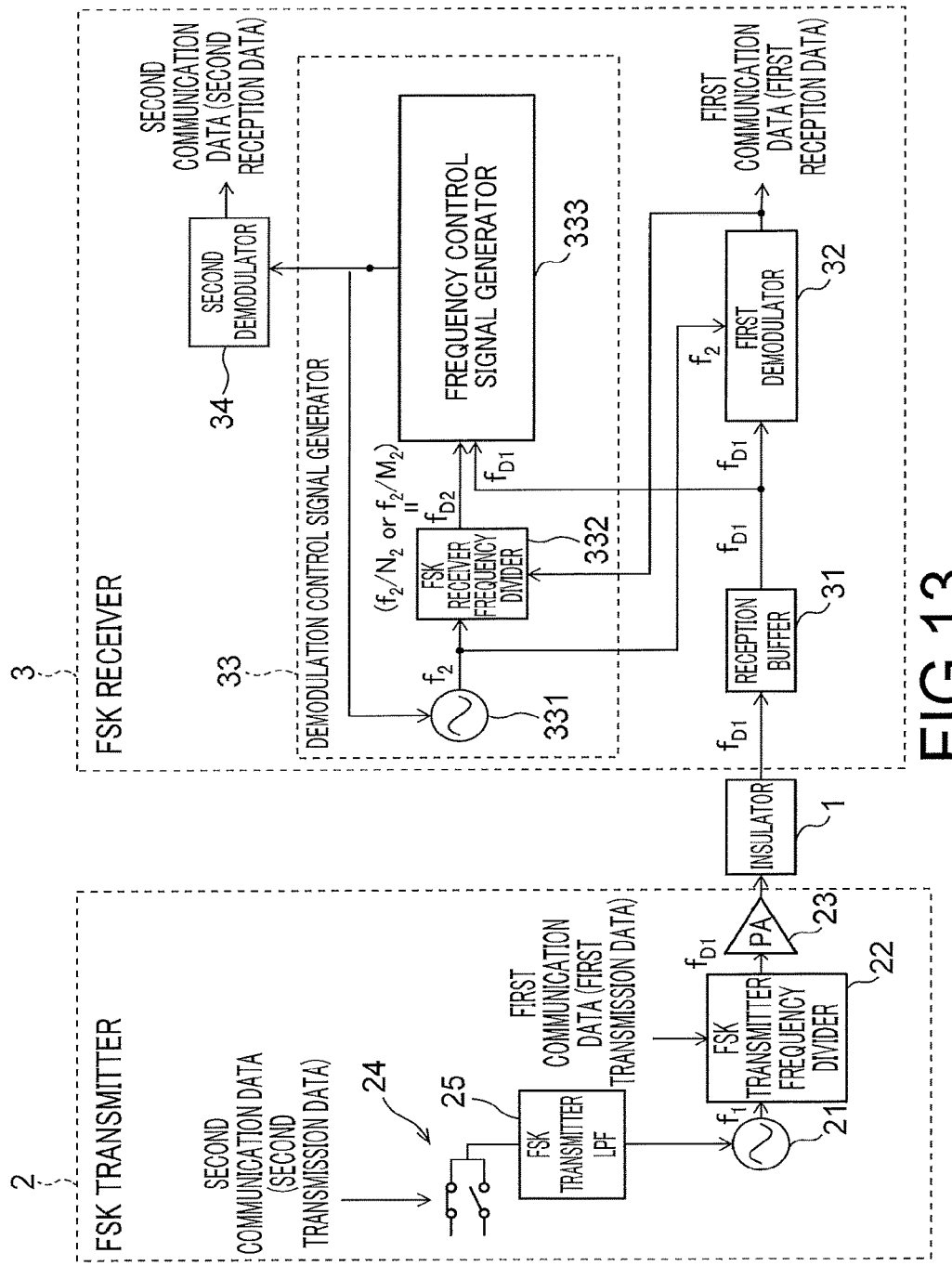
FIG. 13 is a block diagram showing an example of the schematic configuration of a signal processing device according to the second embodiment.

FIG. 13 is a block diagram showing an example of the schematic configuration of the signal processing device according to the second embodiment. In the second embodiment, the FSK transmitter 2 further includes a reference transmission frequency controller 24 and an FSK transmitter low pass filter (LPF) 25, and the FSK receiver 3 further includes a second demodulator 34. The description of the same points as in the first embodiment will be omitted.

The signal processing device in the second embodiment transmits/receives second communication data, which is different from the first communication data, concurrently with the first communication data. As in the first embodiment, the second communication data input to the FSK transmitter 2 is particularly denoted as second transmission data, and the second communication data demodulated in the FSK receiver 3 is particularly denoted as second reception data.

As explained in the first embodiment, to cause a clock frequency $f_2$ to follow a reference transmission frequency $f_1$, the FSK receiver 3 generates a frequency control signal, thereby adjusting the clock frequency $f_2$. Therefore, the frequency control signal fluctuates with fluctuations in the reference transmission frequency $f_1$. For this reason, in the second embodiment, a reference transmission frequency $f_1$ naturally fluctuating due to temperature and the like in the first embodiment is intentionally controlled according to second transmission data. Second reception data is obtained through the frequency control signal fluctuating according to the controlled reference transmission frequency $f_1$.

The reference transmission frequency controller 24 transmits a control signal related to the reference transmission frequency $f_1$ to the FSK transmitter oscillator 21. This control signal is denoted as a reference transmission frequency control signal. Since the oscillation frequency of an oscillator, such as a VOC, can be controlled through a control voltage, the reference transmission frequency control signal may be a voltage. For example, voltage $V_{DATA2\_1}$ and voltage $V_{DATA2\_2}$ may be transmitted from the reference transmission frequency controller 24 to the FSK transmitter oscillator 21 when the second signal is Low and when the second signal is High, respectively.

An FSK transmitter LPF 25, which is generally used, adjusts the frequency band of a reference transmission frequency control signal. Incidentally, the cut-off frequency of the FSK transmitter LPF 25 is set to a frequency lower than the loop band of the demodulation control signal generator 33. Further, the signal rate of the second communication data is set to a frequency lower than the cut-off frequency of the FSK transmitter LPF 25.

The FSK transmitter oscillator 21 controls the oscillation frequency, on the basis of the reference transmission frequency control signal from the FSK transmitter LPF 25, to adjust the reference transmission frequency $f_1$. Thus, the FSK signal frequency also fluctuates with the value of the second communication data. As described in the first embodiment, a frequency control signal according to fluctuations in the FSK signal frequency is generated.

Figure 14:
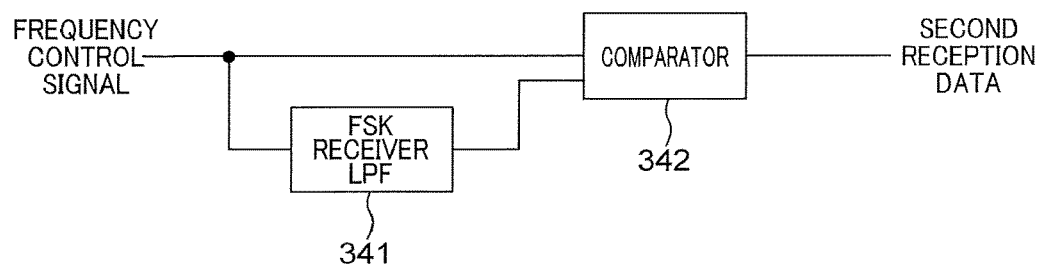
FIG. 14 is a diagram showing a first configuration example of a second demodulator.

The second demodulator 34 receives the frequency control signal from the frequency control signal generator 333 and then demodulates the second communication data according to fluctuations in the frequency control signal. FIG. 14 is a diagram showing an example of the first configuration of the second demodulator 34. In the example shown in FIG. 14, the second demodulator 34 includes an FSK receiver LPF 341 and a comparator 342. The FSK receiver LPF 341 removes components related to the second transmission data from the frequency control signal. The comparator obtains the second reception data by comparing the frequency control signal with the frequency control signal from which components related to the second communication data is removed.

Figure 15:
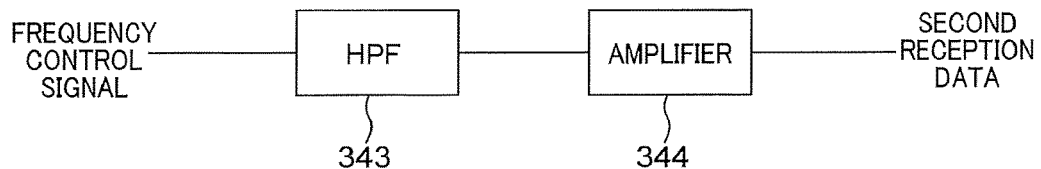
FIG. 15 is a diagram showing a second configuration example of the second demodulator.

FIG. 15 is a diagram showing an example of the second configuration example of the second demodulator 34. When the second communication data is coded with a signal form that does not contain direct current components, such as a Manchester code, the second configuration example shown in FIG. 15 may be used. In the example shown in FIG. 15, the second demodulator 34 includes a high pass filter (HPF)

343 and an amplifier 344. The HPF 343 in the second demodulator 34 removes direct current components and retrieves alternating current components from the frequency control signal. The amplifier 344 amplifies the alternating current components in the frequency control signal, thereby obtaining second reception data. Incidentally, a BPF that transmits desired signal components may be used instead of the HPF 343.

As described above, according to this embodiment, the FSK transmitter 2 controls the reference transmission frequency $f_1$ for transmission of the second communication data, and the FSK receiver 3 obtains the second communication data through the frequency control signal that fluctuates according to the reference transmission frequency $f_1$. Thus, this embodiment results in a large amount of data that is transmitted/received at once, compared with the first embodiment.

Third Embodiment

Figure 16:
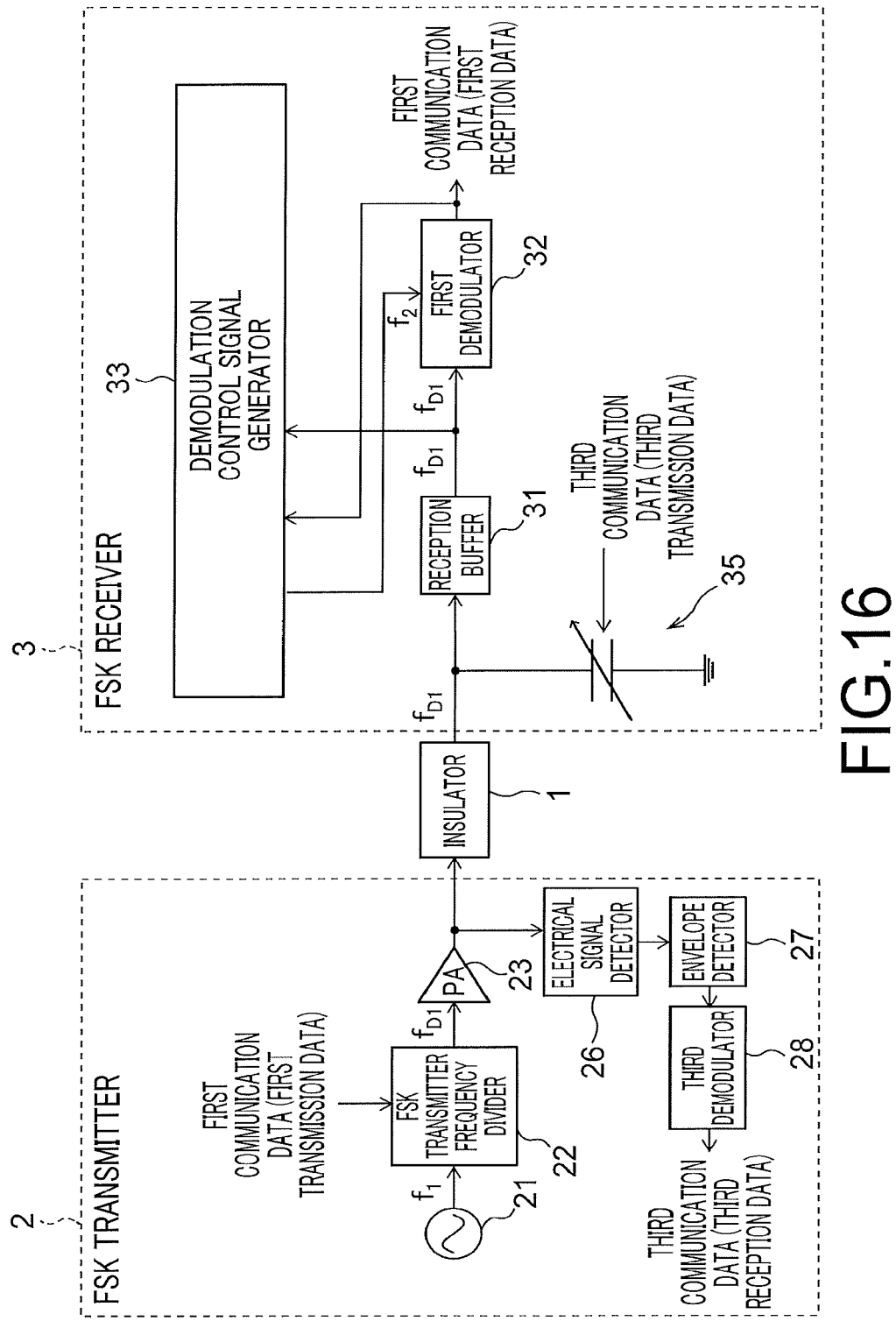
FIG. 16 is a block diagram showing an example of the schematic configuration of a signal processing device according to the third embodiment.

FIG. 16 is a block diagram showing an example of the schematic configuration of the signal processing device according to the third embodiment. The third embodiment differs from the embodiment that has been described so far in that the FSK transmitter 2 further includes an electrical signal detector 26, an envelope detector 27, and a third demodulator 28, and the FSK receiver 3 further includes a variable load device 35 connected to the insulator 1. Instead of adding components to the first embodiment as in FIG. 16, components may be added to the second embodiment. The description of the same points as in the above-described embodiment will be omitted.

In the signal processing device of the third embodiment, third communication data, which is different from the communication data that has been described above, is transmitted from the FSK receiver 3 at the reception-side of FSK communication to the FSK transmitter 2 at the transmission-side of FSK communication. Data newly transmitted/received in the third embodiment is denoted as third communication data. Further, the third communication data input to the FSK receiver 3 is particularly denoted as third transmission data, and the third communication data demodulated in the FSK transmitter 2 is particularly denoted as third reception data.

The variable load device 35 in the FSK receiver 3 changes its capacity in accordance with the input third communication data. This capacity change causes fluctuations in the output of the transmission amplifier 23 in the FSK transmitter 2, that is, the envelopes of the voltage and current of the FSK signal input to the insulator 1. Accordingly, the FSK transmitter 2 can obtain third communication data from the fluctuations. Load modulation in the third embodiment is performed in this manner.

The electrical signal detector 26 in the FSK transmitter 2 detects the voltage or current of the FSK signal input to the insulator 1. The envelope detector 27 in the FSK transmitter 2 calculates the envelope of the voltage or current detected by the electrical signal detector 26, and detects fluctuations in the envelope. The third demodulator 28 in the FSK transmitter 2 demodulates the third communication data in accordance with fluctuations in the envelope detected by the envelope calculator. Demodulation in the third demodulator 28 may be similar to demodulation in the second demodulator 34, and the internal configuration of the third demodulator 28 may be similar to that of the second demodulator 34. Accordingly, the FSK transmitter 2 can obtain the third communication data.

As described above, in this embodiment, the variable load device 35 in the FSK receiver 3 performs load modulation, and the FSK transmitter 2 obtains third communication data in accordance with fluctuations in the envelopes of the voltage and the current of the FSK signal input to the insulator 1. Consequently, data can also be transmitted from the FSK receiver 3.

Fourth Embodiment

Figure 17:
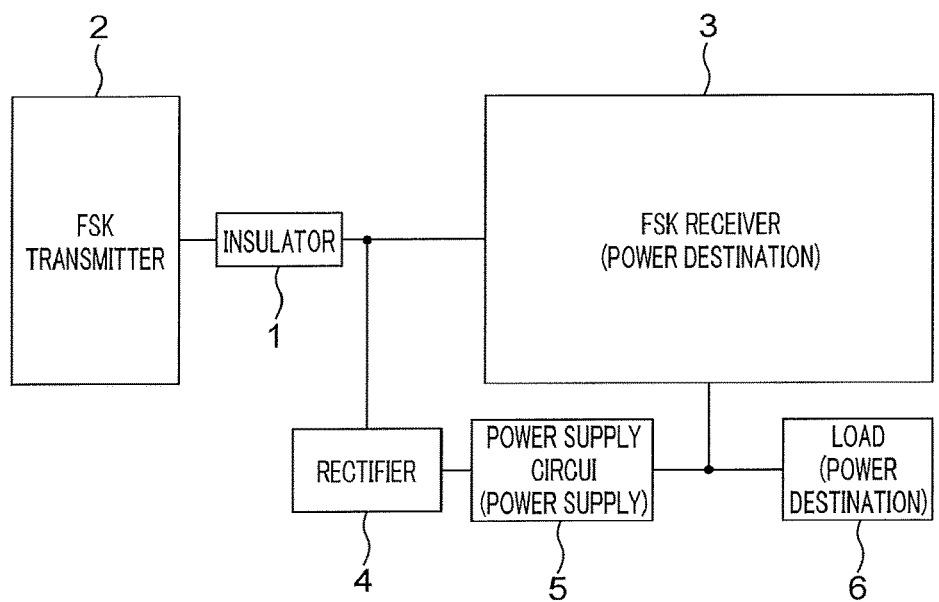
FIG. 17 is a block diagram showing an example of the schematic configuration of a signal processing device according to the fourth embodiment.

FIG. 17 is a block diagram showing an example of the schematic configuration of the signal processing device according to the fourth embodiment. The fourth embodiment differs from the embodiments that have been described above in that the signal processing device further includes a rectifier 4, a power supply circuit (power supply) 5, and a load (power destination) 6. The description of the same points as in the above-described embodiment will be omitted.

In FSK communication, independently of communication data, transmission of a carrier signal having a constant amplitude is continued. Therefore, FSK communication is suitable for concurrent transmission of electric power compared with other communication schemes in which disappearing of a carrier signal, variations in the amplitude of the carrier signal, and the like occur in accordance with communication data. Therefore, in this embodiment, power transmission is performed using carrier waves in FSK communication.

The rectifier 4 is connected to the insulator 1 and converts power supplied through a carrier signal into a direct current voltage and outputs it. The power supply circuit 5 controls the direct-current voltage output from the rectifier 4 for conversion into an output voltage suitable for a predetermined power destination.

The output voltage from the power supply circuit 5 is supplied to a load 6. Alternatively, it may be supplied to the FSK receiver 3 and used as power for operating the components of the FSK receiver 3 or the entire device. In this case, the load 6 may be omitted. Further, there is no limitation on the supply destination of the output voltage and the output voltage from the power supply circuit 5 may be supplied to an external device not shown in the drawing.

As described above, in this embodiment, power can be transmitted from the FSK transmitter 2 to the FSK receiver 3.

Incidentally, in each embodiment described above, the components of the signal processing device may partly be provided in an external device. For example, although the FSK transmitter 2 and the FSK receiver 3 are provided in the same signal processing device in the embodiments described above, the FSK transmitter 2 and the FSK receiver 3 may be provided in different devices. In other words, a first signal processing device including the FSK transmitter 2 and a second signal processing device including the FSK receiver 3 may be present, and the first signal processing device and the second signal processing device may perform the processing according to the above-described embodiments.

In addition, although signal processing devices that perform FSK communication through the insulator 1 have been described, the processing of FSK communication in the above-described embodiments is not limited to that of FSK communication through the insulator 1. For example, the processing of the above-described FSK communication is also applicable in a signal processing device using public radio waves. For example, if downsizing of the signal processing device is required, a signal processing device performing the processing of the above-described FSK communication can be manufactured. The signal processing device does not require a crystal oscillator and thus has a less parts count, achieving downsizing.

Incidentally, the components of the signal processing device in the above embodiments may be implemented using a dedicated hardware, such as an integrated circuit (IC) mounted with a processor, a memory, and the like. For example, the signal processing device 1 may include a circuit for implementation of the FSK transmitter 2 and a circuit for implementation of the FSK receiver 3. The internal configurations of the FSK transmitter 2 and the FSK receiver 3 may also be implemented using dedicated circuits. Alternatively, a component may be implemented using a software (program). When a software (program) is used, the above-described embodiments can be implemented by, for example, using a general-use computer device as a basic hardware and executing a program stored in a memory in a processor such as a central processing unit (CPU) in the computer device.

The term "memory" subsumes any electronic component that can store electronic information. A "memory" may refer to a random access memory (RAM), a read only memory (ROM), a programmable read only memory (PROM), an erasable programmable read only memory (EPROM), an electrically erasable PROM (EEPROM), a nonvolatile random access memory (NVRAM), a Flash memory, or a magnetic or optical signal storage, which are readable by a processor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A signal processing device comprising a receiver configured to receive a modulation signal that has been subjected to frequency shift keying, by dividing a reference transmission frequency by using a first or second transmission division ratio selected in accordance with a value of first communication data,
   wherein the receiver includes:
      a first demodulator configured to obtain the first communication data by demodulating the modulation signal on the basis of a demodulation control signal; and
      a demodulation control signal generator configured to generate the demodulation control signal on the basis of the modulation signal and the demodulated first communication data, and
   wherein the demodulation control signal generator includes:
      a first frequency divider configured to divide a frequency of a first comparison signal that is one of the modulation signal and the demodulation control signal, by a first or second reception division ratio selected in accordance with a value of the demodulated first communication data;
      a frequency control signal generator configured to generate a frequency control signal for controlling a frequency of the demodulation control signal on the basis of a frequency of a second comparison signal that is the other of the modulation signal and the demodulation control signal, and a frequency of the first comparison signal obtained by division by the first or second reception division ratio; and
      a first oscillator configured to oscillate at a frequency based on the frequency control signal to generate the demodulation control signal.

2. The signal processing device according to claim 1, wherein the frequency of the demodulation control signal follows fluctuations in the reference transmission frequency by adjusting the first transmission division ratio, the second transmission division ratio, the first reception division ratio, and the second reception division ratio to satisfy a predetermined relational expression.

3. The signal processing device according to claim 1,
   wherein the first frequency divider divides a frequency of the second comparison signal by a third reception division ratio, and
   wherein the frequency control signal is generated on the basis of a frequency of the second comparison signal obtained by division by the third reception division ratio and a frequency of the first comparison signal obtained by division by the first or second reception division ratio.

4. The signal processing device according to claim 1,
   wherein a relational expression of $N_2/N_1 = M_2/M_1$ is satisfied, where $f_1$ is the reference transmission frequency, $f_2$ is a frequency of the demodulation control signal, $N_1$ ($N_1$ is an integer) is the first transmission division ratio, $M_1$ ($M_1$ is an integer satisfying $N_1 < M_1$) is the second transmission division ratio, $N_2$ ($N_2$ is an integer) is the first reception division ratio, and $M_2$ ($M_2$ is an integer satisfying $N_2 < M_2$) is the second reception division ratio, and
   wherein the frequency of the demodulation control signal is controlled such that a relational expression of $f_2 = (N_2/N_1) \times f_1/K$ (K is an integer) is satisfied.

5. The signal processing device according to claim 1,
   wherein a relational expression of $N_1 \times N_2 = M_1 \times M_2$ is satisfied in a case where $f_1$ is the reference transmission frequency, $f_2$ is a frequency of the demodulation control signal, $N_1$ ($N_1$ is an integer) is the first transmission division ratio, $M_1$ ($M_1$ is an integer satisfying $N_1 < M_1$) is the second transmission division ratio, $N_2$ ($N_2$ is an integer) is the first reception division ratio, and $M_2$ ($M_2$ is an integer satisfying $N_2 < M_2$) is the second reception division ratio, and
   wherein the frequency of the demodulation control signal is controlled such that a relational expression of $f_2 = \{f_1/(N_1 \times N_2)\} \times K$ (K is an integer) is satisfied in the case.

6. The signal processing device according to claim 1,
   wherein the modulation signal fluctuates in accordance with a value of second communication data, and
   wherein the receiver further includes a second demodulator configured to obtain the second communication data by demodulating the frequency control signal on the basis of fluctuations in the modulation signal detected from the frequency control signal.

7. The signal processing device according to claim 1,
   wherein the receiver determines at least one of the frequency of the demodulation control signal, the first reception division ratio, and the second reception division ratio in a calibration mode period, and
   wherein demodulation of the modulation signal is started after the end of the calibration mode period.

8. The signal processing device according to claim 1, wherein the first demodulator includes:
   a delay adder configured to generate a delay signal by adding a delay time to the modulation signal, and
   a comparator configured to obtain the first communication data by comparing the modulation signal with a delay signal of the modulation signal.

9. The signal processing device according to claim 1, wherein the first demodulator includes:
   a first delay adder configured to generate a first delay signal by adding a first delay time to the modulation signal,
   a first comparator configured to generate a third comparison signal by comparing the modulation signal with the first delay signal,
   a second delay adder configured to generate a second delay signal by adding a second delay time to the modulation signal,
   a second comparator configured to generate a fourth comparison signal by comparing the opposite-phase signal of the modulation signal with the second delay signal, and
   a third comparator configured to obtain the first communication data by comparing the third comparison signal with the fourth comparison signal.

10. The signal processing device according to claim 1, further comprising:
   a transmitter configured to transmit the modulation signal; and
   an insulator configured to provide insulation between the transmitter and the receiver,
   wherein the transmitter includes:
      a second oscillator configured to oscillate at the reference transmission frequency to generate a reference transmission signal; and
      a third frequency divider configured to divide the reference transmission frequency by the first or second transmission division ratio selected in accordance with a value of the first communication data to generate the modulation signal,
   wherein the insulator generates a high-frequency electromagnetic field on the basis of the modulation signal, and
   wherein the insulator generates a high-frequency electrical signal on the basis of the high-frequency electromagnetic field, and
   wherein the receiver receives the modulation signal by receiving the electrical signal.

11. The signal processing device according to claim 10, wherein the insulator includes at least a transformer.

12. The signal processing device according to claim 10, wherein the insulator includes at least a capacitor element.

13. The signal processing device according to claim 10, further comprising:
   a rectifier configured to convert an electrical signal from the insulator into a direct current voltage; and
   a power supply circuit configured to convert the direct current voltage from the rectifier into a predetermined output voltage.

14. The signal processing device according to claim 10, wherein the receiver includes a variable load device configured to change a load in accordance with a value of third communication data, and
   wherein the transmitter includes a third demodulator configured to obtain the third communication data by demodulating an envelope output of the voltage or current calculated by an envelope detector on the basis of fluctuations in the current or voltage of the modulation signal transmitted to the insulator, the fluctuations occurring with fluctuations in the load on the variable load device.

15. A signal processing method performed by a signal processing device configured to receive a modulation signal that has been subjected to frequency shift keying, by dividing a reference transmission frequency by using a first or second transmission division ratio selected in accordance with a value of first communication data, the signal processing method comprises:
   (a) obtaining the first communication data by demodulating the modulation signal on the basis of a demodulation control signal; and
   (b) generating the demodulation control signal on the basis of the modulation signal and the demodulated first communication data,
   wherein (b) includes:
      dividing a frequency of a first comparison signal that is one of the modulation signal and the demodulation control signal, by a first or second reception division ratio selected in accordance with a value of the demodulated first communication data,
      generating a frequency control signal for controlling a frequency of the demodulation control signal on the basis of a frequency of a second comparison signal that is the other of the modulation signal and the demodulation control signal, and a frequency of the first comparison signal obtained by division by the first or second reception division ratio, and
      oscillating at a frequency based on the frequency control signal to generate the demodulation control signal.

* * * * *